(12) United States Patent
Akram et al.

(10) Patent No.: US 8,816,463 B2
(45) Date of Patent: Aug. 26, 2014

(54) WAFER-LEVEL PACKAGED MICROELECTRONIC IMAGERS HAVING INTERCONNECTS FORMED THROUGH TERMINALS

(75) Inventors: Salman Akram, Boise, ID (US); Peter A. Benson, Boise, ID (US); Warren M. Farnworth, Nampa, ID (US); William M. Hiatt, Eagle, ID (US)

(73) Assignee: Round Rock Research, LLC, Jersey City, NJ (US)

( * ) Notice: Subject to any disclaimer, the term of this patent is extended or adjusted under 35 U.S.C. 154(b) by 0 days.

(21) Appl. No.: 13/349,143

(22) Filed: Jan. 12, 2012

(65) Prior Publication Data

US 2012/0104528 A1    May 3, 2012

Related U.S. Application Data

(63) Continuation of application No. 10/863,994, filed on Jun. 9, 2004, now abandoned.

(51) Int. Cl.
    *H01L 31/00*    (2006.01)
(52) U.S. Cl.
    USPC .......................................................... 257/459
(58) Field of Classification Search
    CPC ...................... H01L 31/0224; H01L 31/02327
    USPC ..................... 438/69, 98; 257/459, E31.124
    See application file for complete search history.

(56) References Cited

U.S. PATENT DOCUMENTS

| | | | |
|---|---|---|---|
| 3,345,134 A | 10/1967 | Heymer et al. | |
| 4,534,100 A | 8/1985 | Lane | |
| 4,906,314 A | 3/1990 | Farnworth et al. | |
| 5,130,783 A | 7/1992 | McLellan | |
| 5,371,397 A | 12/1994 | Maegawa et al. | |
| 5,424,573 A | 6/1995 | Kato et al. | |

(Continued)

FOREIGN PATENT DOCUMENTS

| | | |
|---|---|---|
| EP | 0886323 A2 | 12/1998 |
| EP | 1157967 A2 | 11/2001 |

(Continued)

OTHER PUBLICATIONS

Kingpak Technology, Inc. "CMOS Image Sensor Packaging," 1 page, retrieved from the Internet on Aug. 26, 2003, <http://www.kingpak.com/CMOSImager.html>.

(Continued)

*Primary Examiner* — Kevin Parendo
(74) *Attorney, Agent, or Firm* — Lerner, David, Littenberg, Krumholz & Mentlik, LLP

(57) ABSTRACT

The following disclosure describes several embodiments of (1) methods for wafer-level packaging of microelectronic imagers, (2) methods of forming electrically conductive interconnects in microelectronic imagers, (3) methods for forming optical devices for microelectronic imagers, and (4) microelectronic imagers that have been packaged using wafer-level packaging processes. Wafer-level packaging of microelectronic imagers is expected to significantly enhance the efficiency of manufacturing microelectronic imagers because a plurality of imagers can be packaged simultaneously using highly accurate and efficient processes developed for packaging semiconductor devices. Moreover, wafer-level packaging of microelectronic imagers is expected to enhance the quality and performance of such imagers because the semiconductor fabrication processes can reliably align an optical device with an image sensor and space the optical device apart from the image sensor by a desired distance with a higher degree of precision.

18 Claims, 35 Drawing Sheets

(56) References Cited

U.S. PATENT DOCUMENTS

| | | | |
|---|---|---|---|
| 5,435,887 A | 7/1995 | Rothschild et al. | |
| 5,505,804 A | 4/1996 | Mizuguchi et al. | |
| 5,560,047 A | 10/1996 | Shimada | |
| 5,593,913 A | 1/1997 | Aoki | |
| 5,605,783 A | 2/1997 | Revelli et al. | |
| 5,672,519 A | 9/1997 | Song et al. | |
| 5,694,246 A | 12/1997 | Aoyama et al. | |
| 5,708,293 A | 1/1998 | Ochi et al. | |
| 5,771,158 A | 6/1998 | Yamagishi et al. | |
| 5,776,824 A | 7/1998 | Farnworth et al. | |
| 5,811,799 A | 9/1998 | Wu | |
| 5,821,532 A | 10/1998 | Beaman et al. | |
| 5,857,963 A | 1/1999 | Pelchy et al. | |
| 5,861,654 A | 1/1999 | Johnson | |
| 5,877,040 A | 3/1999 | Park et al. | |
| 5,897,338 A | 4/1999 | Kaldenberg | |
| 5,914,488 A | 6/1999 | Sone | |
| 5,977,535 A | 11/1999 | Rostoker | |
| 5,998,862 A | 12/1999 | Yamanaka | |
| 6,080,291 A | 6/2000 | Woodruff et al. | |
| 6,104,086 A | 8/2000 | Ichikawa et al. | |
| 6,114,240 A | 9/2000 | Akram et al. | |
| 6,143,588 A | 11/2000 | Glenn | |
| 6,236,046 B1 | 5/2001 | Watabe et al. | |
| 6,259,083 B1 | 7/2001 | Kimura | |
| 6,266,197 B1 | 7/2001 | Glenn et al. | |
| 6,274,927 B1 | 8/2001 | Glenn | |
| 6,285,047 B1 | 9/2001 | Machida et al. | |
| 6,285,064 B1 | 9/2001 | Foster | |
| 6,351,027 B1 | 2/2002 | Giboney et al. | |
| 6,372,548 B2 | 4/2002 | Bessho et al. | |
| 6,407,381 B1 | 6/2002 | Glenn et al. | |
| 6,411,439 B2 | 6/2002 | Nishikawa | |
| 6,483,652 B2 | 11/2002 | Nakamura | |
| 6,503,780 B1 | 1/2003 | Glenn et al. | |
| 6,541,762 B2 | 4/2003 | Kang et al. | |
| 6,566,745 B1 | 5/2003 | Beyne et al. | |
| 6,603,183 B1 | 8/2003 | Hoffman | |
| 6,617,623 B2 | 9/2003 | Rhodes | |
| 6,661,047 B2 | 12/2003 | Rhodes | |
| 6,667,551 B2 | 12/2003 | Hanaoka et al. | |
| 6,670,986 B1 | 12/2003 | Ben Shoshan et al. | |
| 6,686,588 B1 | 2/2004 | Webster et al. | |
| 6,703,310 B2 | 3/2004 | Mashino et al. | |
| 6,734,419 B1 | 5/2004 | Glenn et al. | |
| 6,759,266 B1 | 7/2004 | Hoffman | |
| 6,774,486 B2 | 8/2004 | Kinsman | |
| 6,778,046 B2 | 8/2004 | Stafford et al. | |
| 6,791,076 B2 | 9/2004 | Webster | |
| 6,795,120 B2 | 9/2004 | Takagi et al. | |
| 6,797,616 B2 | 9/2004 | Kinsman | |
| 6,800,943 B2 | 10/2004 | Adachi | |
| 6,813,154 B2 | 11/2004 | Diaz et al. | |
| 6,825,458 B1 | 11/2004 | Moess et al. | |
| 6,828,663 B2 | 12/2004 | Chen et al. | |
| 6,828,674 B2 | 12/2004 | Karpman | |
| 6,844,978 B2 | 1/2005 | Harden et al. | |
| 6,864,172 B2 | 3/2005 | Noma et al. | |
| 6,882,021 B2 | 4/2005 | Boon et al. | |
| 6,885,107 B2 | 4/2005 | Kinsman | |
| 6,934,065 B2 | 8/2005 | Kinsman | |
| 6,946,325 B2 | 9/2005 | Yean et al. | |
| 7,059,040 B1 * | 6/2006 | Webster et al. | 29/831 |
| 7,091,124 B2 | 8/2006 | Rigg et al. | |
| 2002/0006687 A1 | 1/2002 | Lam | |
| 2002/0019069 A1 * | 2/2002 | Wada | 438/69 |
| 2002/0057468 A1 | 5/2002 | Segawa et al. | |
| 2002/0089025 A1 | 7/2002 | Chou | |
| 2002/0096729 A1 | 7/2002 | Tu et al. | |
| 2002/0113296 A1 | 8/2002 | Cho et al. | |
| 2002/0145676 A1 | 10/2002 | Kuno et al. | |
| 2003/0006260 A1 | 1/2003 | Bassett | |
| 2004/0012698 A1 | 1/2004 | Suda et al. | |
| 2004/0023469 A1 | 2/2004 | Suda | |
| 2004/0038442 A1 | 2/2004 | Kinsman | |
| 2004/0041261 A1 | 3/2004 | Kinsman | |
| 2004/0082094 A1 | 4/2004 | Yamamoto | |
| 2004/0214373 A1 | 10/2004 | Jiang et al. | |
| 2004/0238909 A1 | 12/2004 | Boon et al. | |
| 2004/0245649 A1 | 12/2004 | Imaoka | |
| 2005/0007745 A1 | 1/2005 | Gochnour et al. | |
| 2005/0052751 A1 | 3/2005 | Liu et al. | |
| 2005/0104228 A1 | 5/2005 | Rigg et al. | |
| 2005/0110889 A1 | 5/2005 | Tuttle et al. | |
| 2005/0127478 A1 | 6/2005 | Hiatt et al. | |
| 2005/0151228 A1 | 7/2005 | Tanida et al. | |
| 2005/0184219 A1 | 8/2005 | Kirby | |
| 2005/0236708 A1 | 10/2005 | Farnworth et al. | |
| 2005/0253213 A1 | 11/2005 | Jiang et al. | |
| 2005/0254133 A1 | 11/2005 | Akram et al. | |
| 2005/0270055 A1 | 12/2005 | Akram et al. | |
| 2006/0044450 A1 | 3/2006 | Wolterink et al. | |

FOREIGN PATENT DOCUMENTS

| | | | |
|---|---|---|---|
| FR | 2835654 A1 | 8/2003 | |
| JP | 59101882 A | 6/1984 | |
| JP | 59191388 A | 10/1984 | |
| JP | 07263607 A | 10/1995 | |
| JP | 2001077496 A | 3/2001 | |
| WO | 9005424 A1 | 5/1990 | |
| WO | 02075815 A1 | 9/2002 | |
| WO | 02095796 A2 | 11/2002 | |
| WO | 2004054001 A2 | 6/2004 | |

OTHER PUBLICATIONS

Kramer, S.J. et al., "Annual Report—Applications of Supercritical Fluid Technology to Semiconductor Device Processing," pp. 1-29, Nov. 2001.

Kyocera Corporation, Memory Package, 1 page, retrieved from the Internet on Dec. 3, 2004, <http://Qlobal.kyocera.com/prdcVsemicon/ic pkQ/memory p. html>.

Lin, Tim (Zhigang) and Rick Yoon, "One Package Technique of Exposed MEMS Sensors," Ipp. 105-108, 2002 International Symposium on Microelectronics, Sep. 2002.

Ma, X. et al., "Low Temperature Bonding for Wafer Scale Packaging and Assembly of Micromachined Sensors," Final Report 1998-1999 for MICRO Project 98-144,3 pages, Department of Electrical & Computer EnQineerinQ, University of California, Davis.

Micro Chem, Nano SU-8, Negative Tone Photoresist Formulations 50-100, 4 pages, Feb. 2002, <http://www.microchem.com/products/pdf/SU8 50-100. pdf>.

Optomec, Inc., M3DTM Technology, Maskless Mesoscale Materials Deposition (M3D), 1 page, <http://www.optomec.com/htmllm3d.htm>, retrieved from the Internet on Aug. 15, 2003.

Optomec, Inc., M3DT", Maskless MesoscaleT" Materials Deposition, 2 pages, <http://www.optomec.com/downloads/M3DSheet.pdf>, retrieved from the Internet on Jun. 17, 2005.

PhotoVision Systems, Inc., "Advances in Digital Image Sensors," 22 pages, First Annual New York State Conference on Microelectronic Design, Jan. 12, 2002.

Shen, X.-J. et al., "Microplastic embossing process: experimental and theoretical characterizations," Sensors and Actuators, A 97-98 (20021pp. 428-433, Elsevier Science B.V. Tapes II International Tape and Fabrication Company, Electronics and Electrical Tapes, 2 paQes, 2003, <http://www.tapes2.com/electronics.htm>

TransChip, 1 page, retrieved from the Internet on Aug. 26, 2003, <http://www.missionventures.com/portfolio/companies/transchip.html>.

TransChip, Inc., CMOS vs CCD, 3 pages, retrieved from the Internet on Dec. 14, 2005, <http://www.transchip.com/content.aspx?id=127>.

TransChip, Inc., Technology, 3 pages, retrieved from the Internet on Dec. 14, 2005, <http://www.transchip.com/content.aspx?id=1 0>.

UCI Integrated Nanosystems Research Facility, "Cleaning procedures for glass substrates," 3 pages, Fall 1999.

UCI Integrated Nanosystems Research Facility, "Glass Etch Wet Process," 3 pages, Summer 2000.

(56) References Cited

OTHER PUBLICATIONS

Walker, M.J., "Comparison of Bosch and cryogenic processes for patterning high aspect ratio features in silicon," 11 pages, Proc. SPIE vol. 4407, p. 89-99, MEMS Design, Fabrication, Characterization, and Packaging, Uwe F. Behringer; Deepak G. Uttamchandani; Eds., Apr. 2001.

Xsil, Via Applications, 1 page, <http://www.xsil.com|viaapplications|index.htm>, retrieved from the Internet on Jul. 22, 2003.

Xsil, Vias for 3D Packaging, 1 page, <http://ww.xsil.com/viaapplications/3dpackaging|index.htm>, retrieved from the Internet on Jul. 22, 2003.

Ye, X.R. et al., "Immersion Deposition of Metal Films on Silicon and Germanium Substrates in Supercritical Carbon Dioxide," Chem. Mater. 2003,15,83-91.

Yoshida, J. "TransChip rolls out a single-chip CMOS imager," 3 pages, EE Times, Jul. 18, 2003.

Aachboun, S. and P. Ranson, "Cryogenic etching of deep narrow trenches in silicon," J. Vac. Sci. Technol. A 18 (4), Jul./Aug. 2000, pp. 1848-1852.

Aachboun, S. and P. Ranson, "Deep anisotropic etching of silicon," J. Vac. Sci. Technol. A 17(4), Jul./Aug. 1999, pp. 2270-2273.

Austin, M.D. and S.Y. Chou, "Fabrication of 70 nm channel length polymer organiC thin-film transistors using nanoimprint lithography," Applied Physics Letters, vol. 81, No. 23, pp. 4431-4433, Dec. 2, 2002, American Institute of Physics.

Blackburn, J.M. et al., "Deposition of Conformal Copper and Nickel Films from Supercritical Carbon Dioxide," Science, vol. 294, pp. 141-145, Oct. 5, 2001.

Brubaker, C. et al., "Ultra-thick Lithography for Advanced Packaging and MEMS," SPIE's 27th Annual International Symposium on Microlithography 2002, Mar. 3 o 8, 2002, Santa Clara, CA.

Cheng, Yu-T. et al., "Vacuum Packaging Technology Using Localized Aluminum/Silicon-to-Glass Bonding," Journal of Microelectromechanical Systems, vol. 11, No. 5, pp. 556-565, Oct. 2002.

DuPont Electronic Materials, Data Sheet, pyralux PC 2000 Flexible Composites, 4 pages, Oct. 1998, <http://www.dupont.com|fcm>.

Edmund Industrial Optics, Mounted IR Filters, 1 page, retrieved from the Internet on Jun. 30, 2003, <http://www.edmundoptics.com>.

Hamdorf, M. et al., Surface-rheological measurements on glass forming polymers based on the surface tension driven decay of imprinted corrugation gratings,• Journal of Chemical Physics, vol. 112, No. 9, pp. 4262-4270, Mar. 1, 2000, American Institute of Physics.

Hirafune, S. et al., "Packaging Technology for Imager Using Through-hole Interconnection in Si Substrate," Proceeding of HDP'04, IEEE, pp. 303-306, Jul. 2004.

IBM, Zurich Research Laboratory, EPON SU-8 photoresist, 1 page, retrieved from the Internet on Jan. 21, 2003, <http://www.zurich.ibm.com/sUmems/su8.html>.

Intrinsic Viscosity and Its Relation to Intrinsic Conductivity, 9 pages, retrieved from the Internet on Oct. 30, 2003, <http://www.ciks.cbt.nist.gov/-garbocz/paper58/node3.html>.

King, B. et al., Optomec, Inc., M3Dn.t Technology, Maskless Mesoscale™ Materials Deposition, 5 pages, <http://www.optomec.com|downloads/M3D%20White%Paper%20080502.pdf>, retrieved from the Internet on Jun. 17, 2005.

* cited by examiner

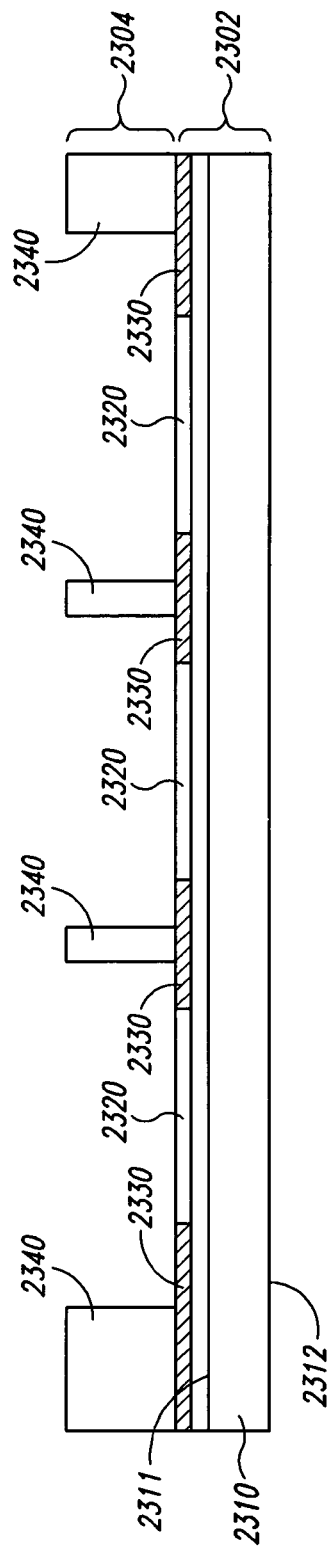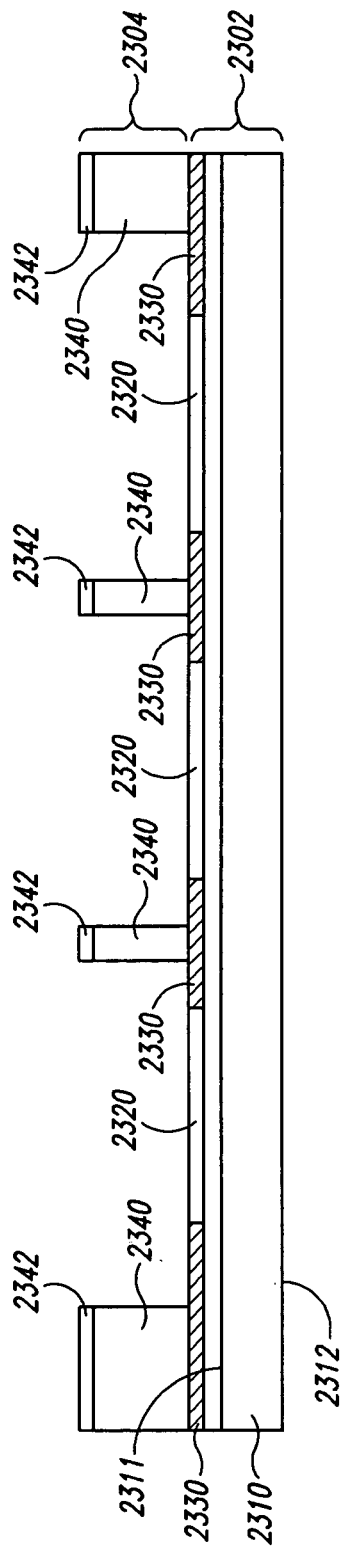
Fig. 23A
Fig. 23B

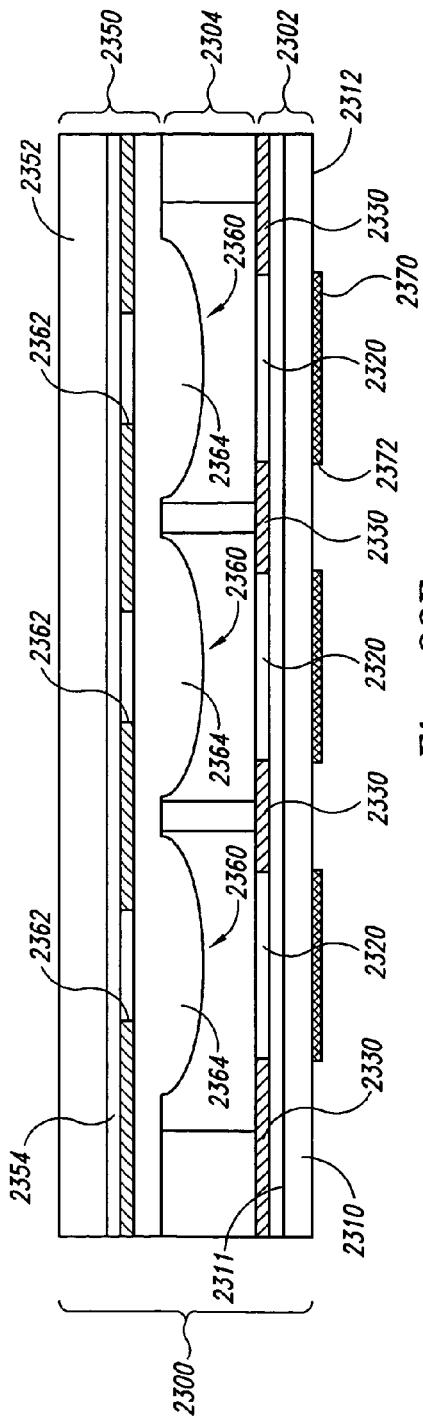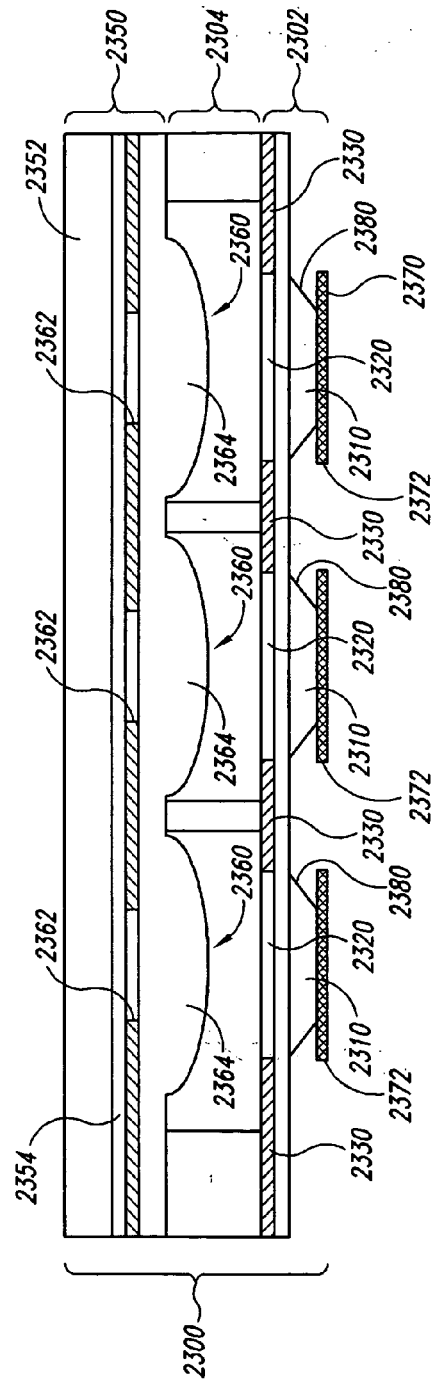

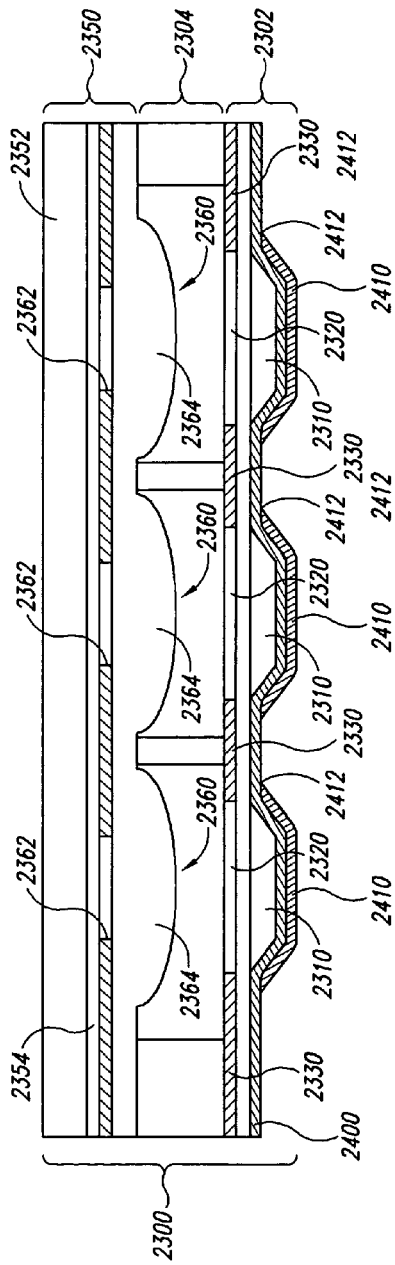
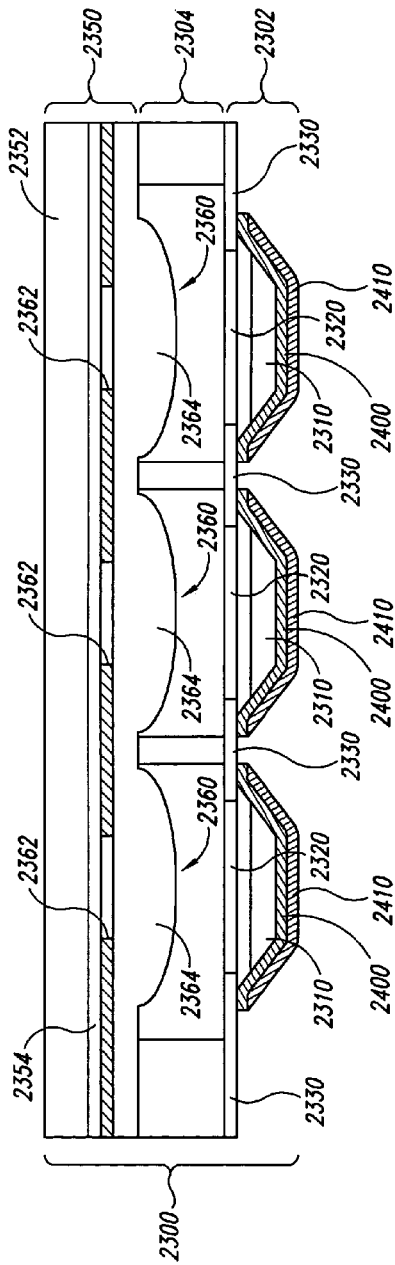
Fig. 23I
Fig. 23J

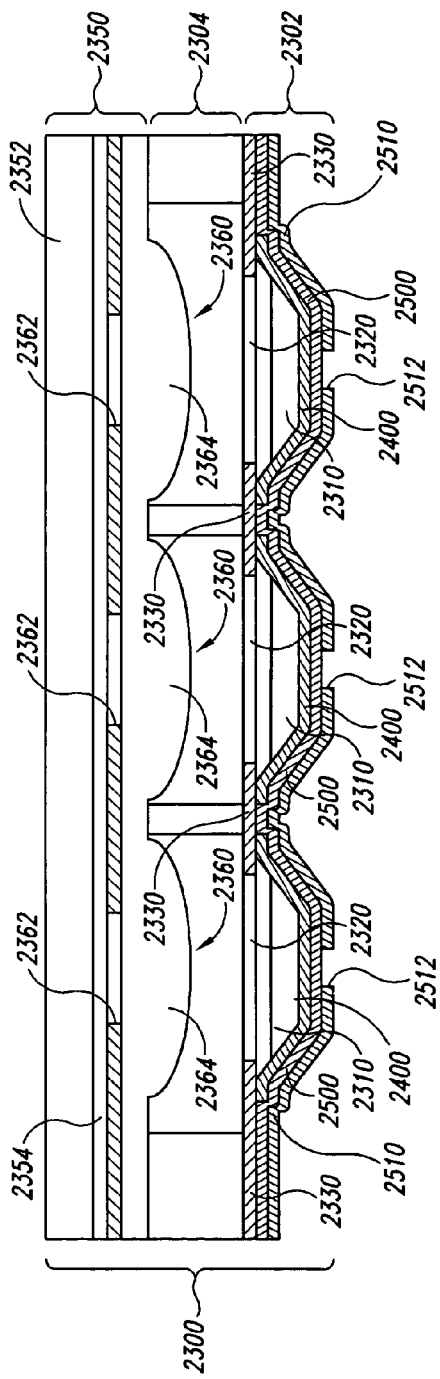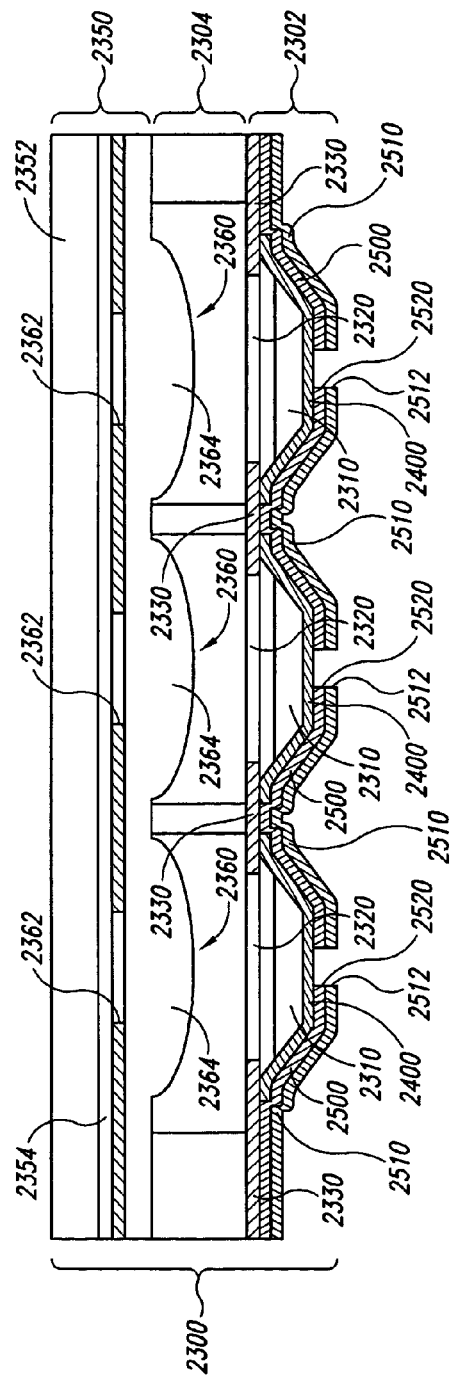

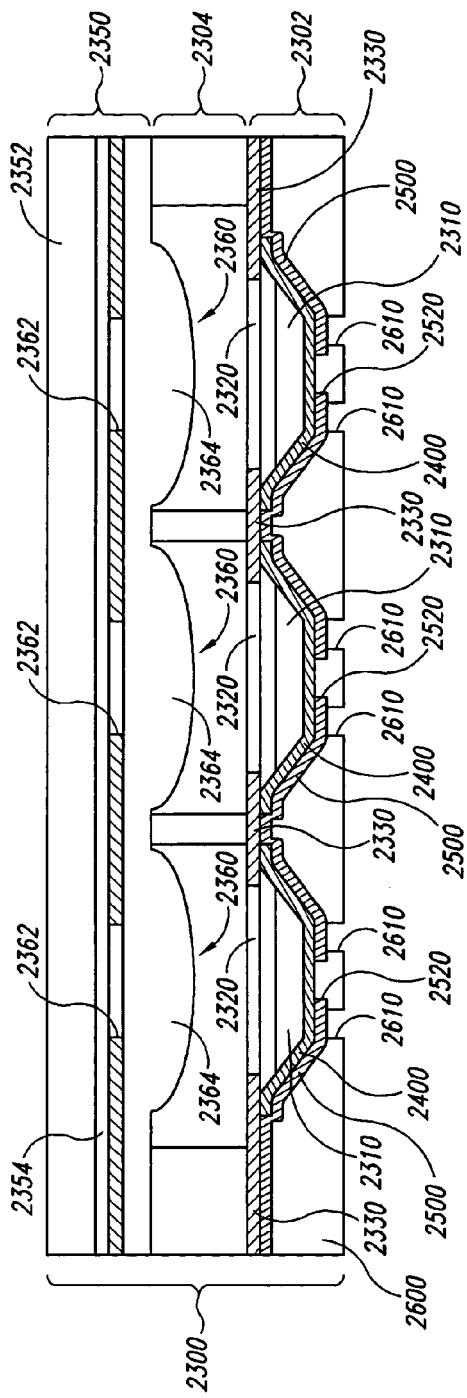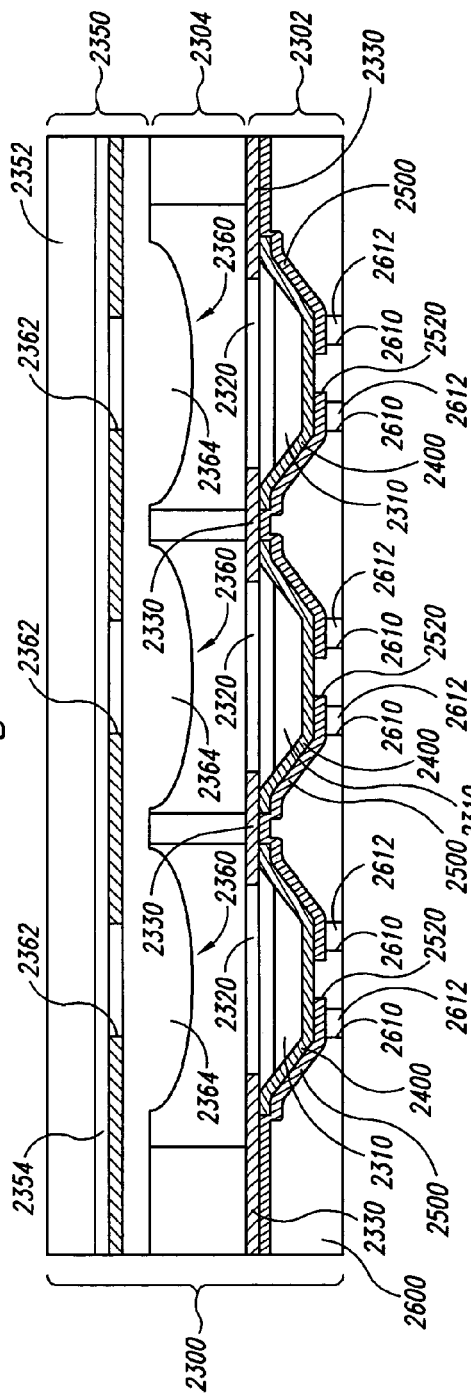

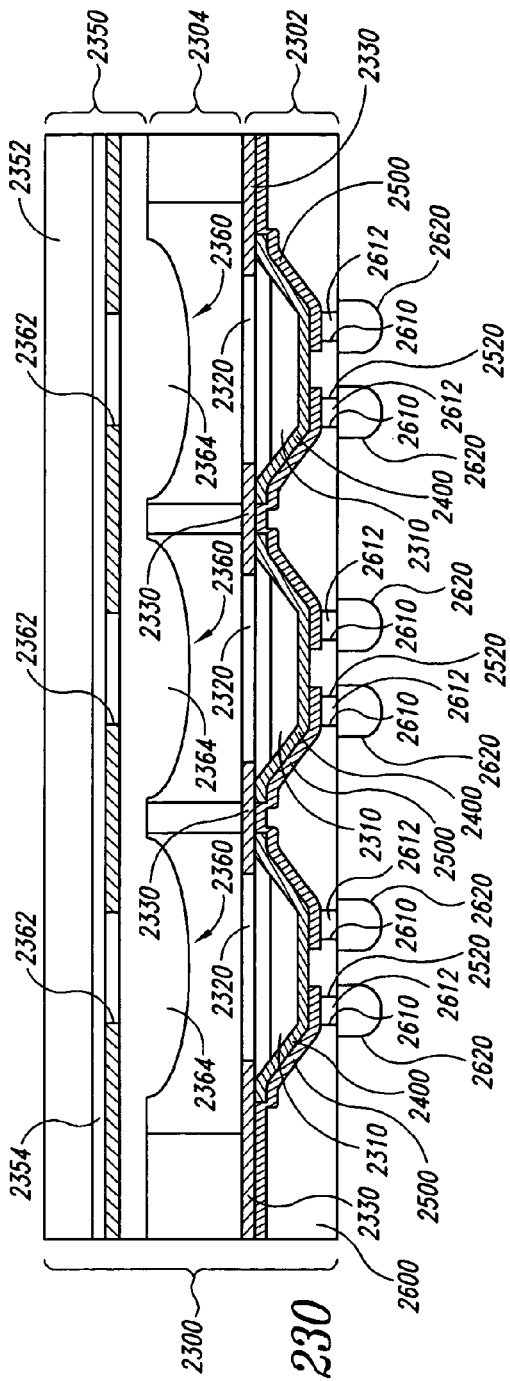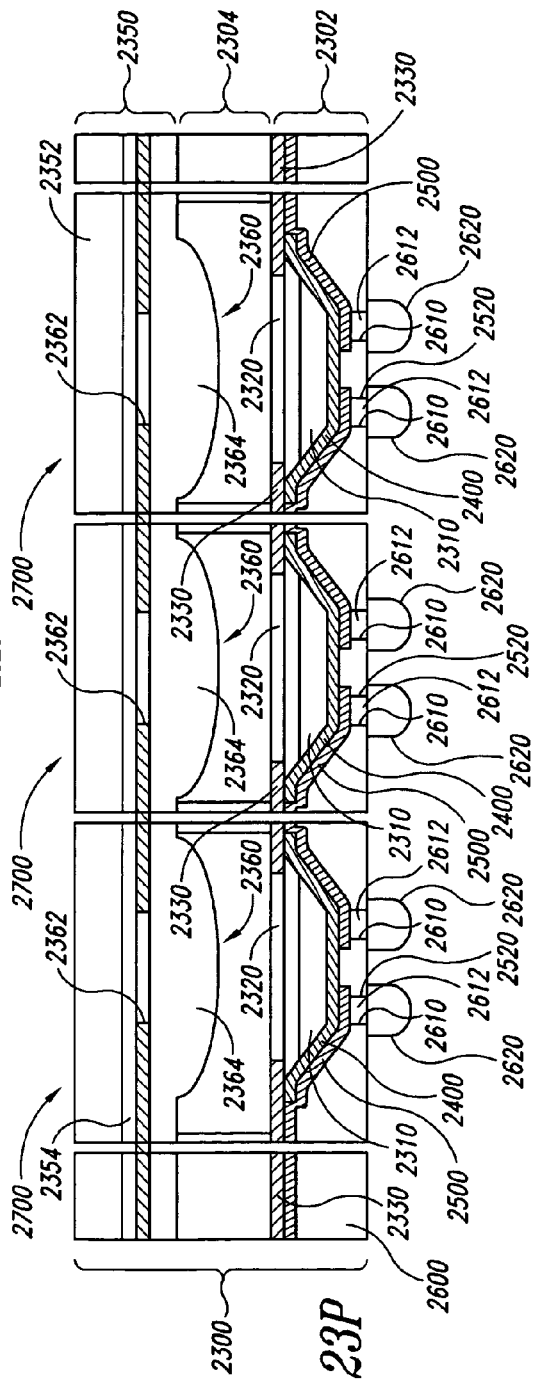

WAFER-LEVEL PACKAGED MICROELECTRONIC IMAGERS HAVING INTERCONNECTS FORMED THROUGH TERMINALS

CROSS-REFERENCE TO RELATED APPLICATIONS

The present application is a continuation of U.S. patent application Ser. No. 10/863,994, filed Jun. 9, 2004, the disclosure of which is incorporated herein by reference.

BACKGROUND OF THE INVENTION

The following disclosure relates generally to microelectronic imagers and methods for packaging microelectronic imagers. Several aspects of the present invention are directed toward wafer-level packaging of microelectronic imagers.

Microelectronic imagers are used in digital cameras, wireless devices with picture capabilities, and many other applications. Cell phones and Personal Digital Assistants (PDAs), for example, are incorporating microelectronic imagers for capturing and sending pictures. The growth rate of microelectronic imagers has been steadily increasing as they become smaller and produce better images with higher pixel counts.

Microelectronic imagers include image sensors that use Charged Coupled Device (CCD) systems, Complementary Metal-Oxide Semiconductor (CMOS) systems, or other systems. CCD image sensors have been widely used in digital cameras and other applications. CMOS image sensors are also quickly becoming very popular because they are expected to have low production costs, high yields and small sizes. CMOS image sensors can provide these advantages because they are manufactured using technology and equipment developed for fabricating semiconductor devices. CMOS image sensors, as well as CCD image sensors, are accordingly "packaged" to protect the delicate components and to provide external electrical contacts.

FIG. 1 is a schematic view of a conventional microelectronic imager 1 with a conventional package. The imager 1 includes a die 10, an interposer substrate 20 attached to the die 10, and a housing 30 attached to the interposer substrate 20. The housing 30 surrounds the periphery of the die 10 and has an opening 32. The imager 1 also includes a transparent cover 40 over the die 10.

The die 10 includes an image sensor 12 and a plurality of bond-pads 14 electrically coupled to the image sensor 12. The interposer substrate 20 is typically a dielectric fixture having a plurality of bond-pads 22, a plurality of ball-pads 24, and traces 26 electrically coupling bond-pads 22 to corresponding ball-pads 24. The ball-pads 24 are arranged in an array for surface mounting the imager 1 to a board or module of another device. The bond-pads 14 on the die 10 are electrically coupled to the bond-pads 22 on the interposer substrate 20 by wire-bonds 28 to provide electrical pathways between the bond-pads 14 and the ball-pads 24.

The imager 1 shown in FIG. 1 also has an optics unit including a support 50 attached to the housing 30 and a barrel 60 adjustably attached to the support 50. The support can include internal threads 52, and the barrel 60 can include external threads 62 engaged with the threads 52. The optics unit also includes a lens 70 carried by the barrel 60.

One problem with packaging conventional microelectronic imagers is that it is difficult to accurately align the lens with the image sensor. Referring to FIG. 1, the centerline of the lens 70 should be aligned with the centerline of the image sensor 12 within very tight tolerances. For example, as microelectronic imagers have higher pixel counts and smaller sizes, the centerline of the lens 70 is often required to be within 50 μm of the centerline of the image sensor 12. This is difficult to achieve with conventional imagers because the support 50 may not be positioned accurately on the housing 30, and the barrel 60 is manually threaded onto the support 50. Therefore, there is a need to align lenses with image sensors with greater precision in more sophisticated generations of microelectronic imagers.

Another problem of packaging conventional microelectronic imagers is that positioning the lens at a desired focus distance from the image sensor is time-consuming and may be inaccurate. The lens 70 shown in FIG. 1 is spaced apart from the image sensor 12 at a desired distance by rotating the barrel 60 (arrow R) to adjust the elevation (arrow E) of the lens 70 relative to the image sensor 12. In practice, an operator rotates the barrel 60 by hand while watching an output of the imager 1 on a display until the picture is focused based on the operator's subjective evaluation. The operator then adheres the barrel 60 to the support 50 to secure the lens 70 in a position where it is spaced apart from the image sensor 12 by a suitable focus distance. This process is problematic because it is exceptionally time-consuming and subject to operator errors.

Yet another concern of conventional microelectronic imagers is that they have relatively large footprints and occupy a significant amount of vertical space (i.e., high profiles). The footprint of the imager in FIG. 1 is the surface area of the bottom of the interposer substrate 20. This is typically much larger than the surface area of the die and can be a limiting factor in the design and marketability of picture cell phones or PDAs because these devices are continually shrinking to be more portable. Therefore, there is a need to provide microelectronic imagers with smaller footprints and lower profiles.

Yet another concern of conventional microelectronic imagers is the manufacturing costs for packaging the dies. The imager 1 shown in FIG. 1 is relatively expensive because manually adjusting the lens 70 relative to the image sensor 12 is very inefficient and subject to error. Moreover, the support 50 and barrel 60 are assembled separately for each die individually after the dies have been singulated from a wafer and attached to the interposer substrate 20. Therefore, there is a significant need to enhance the efficiency, reliability and precision of packaging microelectronic imagers.

DETAILED DESCRIPTION

A. Overview

Figure 2:
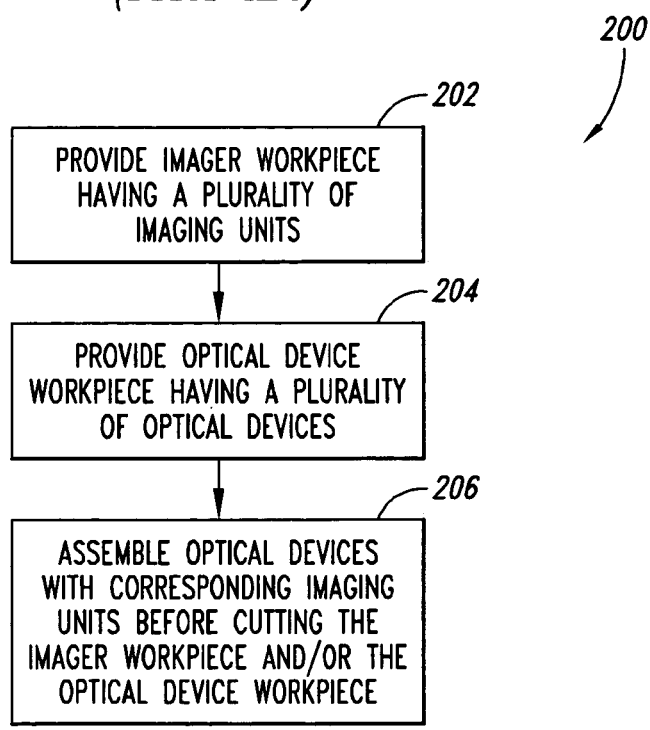
FIG. 2 is a flow chart illustrating a method of packaging microelectronic imagers at the wafer level in accordance with an embodiment of the invention.

FIG. 2 is a flow chart of a wafer-level packaging process 200 for packaging a plurality of microelectronic imagers. The packaging process 200 includes an imaging unit fabrication procedure 202, an optics fabrication procedure 204, and an assembly procedure 206.

The imaging unit fabrication procedure 202 comprises providing an imager workpiece having a first substrate and a plurality of imaging units on and/or in the first substrate. The imaging units can each include an image sensor and a plurality of external electrical contacts electrically coupled to the image sensor. For example, the image sensors can be CMOS image sensors and the external contacts can be backside arrays of contact pads coupled to corresponding image sensors by through-wafer interconnects.

The optics fabrication procedure 204 comprises providing an optical device workpiece having a second substrate and a plurality of optical devices on and/or in the second substrate. The optical devices are typically arranged in a pattern corresponding to the pattern of the imaging units on the first substrate. The optical devices can each include at least one optics element, such as a focus lens or filter.

The assembly procedure 206 comprises assembling the optical devices with corresponding imaging units before cutting the imager workpiece and/or the optical device workpiece. The assembly procedure can include assembling the optical devices with the imaging units before cutting either the first substrate or the second substrate, and then cutting both the first and second substrates to separate individual imagers from each other. In other embodiments, either the imager workpiece is cut to separate the imaging units from each other or the optical device workpiece is cut to separate the optical devices from each other before assembling the optical devices with corresponding imaging units.

The following disclosure describes several embodiments of (1) methods for wafer-level packaging of microelectronic imagers, (2) methods of forming electrically conductive interconnects in microelectronic imagers, (3) methods for forming optical devices for microelectronic imagers, and (4) microelectronic imagers that have been packaged using wafer-level packaging processes. Wafer-level packaging of microelectronic imagers is expected to significantly enhance the efficiency of manufacturing microelectronic imagers because a plurality of imagers can be packaged simultaneously using highly accurate and efficient processes developed for packaging semiconductor devices. Moreover, wafer-level packaging of microelectronic imagers is expected to enhance the quality and performance of such imagers because the semiconductor fabrication processes can reliably align an optical device with an image sensor and space the optical device apart from the image sensor by a desired distance with a high degree of precision. Several embodiments of wafer-level packaging processes for packaging microelectronic imagers and the imagers packaged using such wafer-level packaging processes are thus expected to significantly reduce the costs for assembling microelectronic imagers, increase the performance of microelectronic imagers, and produce smaller imagers compared to conventional devices.

1. Summary of Selected Wafer-Level Packaging Processes

One embodiment of a method for wafer-level packaging of microelectronic imagers comprises providing an imager workpiece comprising a first substrate and a plurality of imaging units formed on and/or in the first substrate. The individual imaging units comprise an image sensor, an integrated circuit formed in the first substrate and electrically coupled to the image sensor, and a plurality of external electrical contacts coupled to the integrated circuit. The external electrical contacts are arranged in a plurality of contact arrays on the first substrate corresponding to the individual imaging units. The method further includes providing an optical device workpiece having a second substrate and a plurality of optical devices formed on and/or in the second substrate. The individual optical devices comprise an optics element, such as a focus lens, a pin-hole lens, and/or a filter. The method continues by assembling the optical devices with corresponding imaging units so that the optics elements are positioned with respect to corresponding image sensors before cutting the first substrate and/or the second substrate.

Another embodiment of a method for wafer-level packaging of microelectronic imagers comprises providing an imager workpiece comprising a first substrate, a plurality of microelectronic image sensors arranged in a pattern on the first substrate, and cutting lanes between adjacent image sensors. The method further includes providing an optical device workpiece comprising a second substrate and a plurality of optics elements arranged at least generally in the pattern of the image sensors on the first substrate. This embodiment further includes fixing the imager workpiece relative to the optical device workpiece so that individual image sensors on the first substrate are aligned with corresponding optics elements on the second substrate. The first and second substrates are then cut along the cutting lanes after fixing the imager workpiece relative to the optical device workpiece to separate individual imagers from each other.

Another embodiment of a method for wafer-level packaging of microelectronic imagers in accordance with the invention comprises forming a plurality of imaging units on and/or in a first substrate having a front side and a backside. Each imaging unit has an image sensor at the front side of the first substrate and external electrical contacts at the backside of the first substrate. The external electrical contacts, for example, can have contact pads on the backside of the first substrate and through-wafer interconnects electrically coupling the contact pads to the image sensors. The method further includes fabricating a plurality of optics elements on and/or in a second substrate, and then fixing the imaging units relative to the optics elements in a spaced apart relationship. The imaging units are fixed relative to the optics elements before cutting the first substrate and/or the second substrate such that the image sensors are sealed within discrete compartments in alignment with a corresponding optics element.

Yet another embodiment of a method for wafer-level packaging of microelectronic imagers in accordance with the invention comprises forming a plurality of imaging units on and/or in a first substrate and fabricating a plurality of optical devices on and/or in a second substrate. The imaging units are arranged in a die pattern on the first substrate, and individual imaging units have an image sensor and an array of external electrical contacts electrically coupled to the image sensor. The optical devices are arranged in a device pattern on the second substrate that corresponds to the die pattern of the imaging units, and individual optical devices have an optics element. The method further includes constructing a spacer having openings arranged to be aligned with the die pattern and the device pattern. This method continues by fixing the first substrate relative to the second substrate with the spacer assembly between the first and second substrates. The first and second substrates are fixed together such that each image sensor on the first substrate is aligned with (a) a corresponding opening of the spacer and (b) a corresponding optics element on the second substrate.

2. Summary of Selected Microelectronic Imager Assemblies

Another aspect of the present invention is directed toward microelectronic imager assemblies that are packaged or otherwise used in wafer-level packaging of microelectronic imagers. One embodiment of a microelectronic imager assembly in accordance with the invention comprises an imager workpiece and an optical device workpiece. The imager workpiece has a first substrate and a plurality of imaging units formed on and/or in the first substrate. The imaging units can each comprise an image sensor, an integrated circuit electrically coupled to the image sensor, and external electrical contacts on the first substrate that are coupled to the integrated circuit. The optical device workpiece has a second substrate and a plurality of optical devices on and/or in the second substrate. The optical devices can comprise an optics element. The first and second substrates are fixed relative to each other in a spaced apart relationship so that the image sensors are aligned with corresponding optics elements.

Another embodiment of a microelectronic imager assembly in accordance with the invention comprises a first substrate having a front side and a back side, a plurality of image sensors at the front side of the first substrate, and a plurality of external electrical contacts. The external electrical contacts include contact pads on the backside of the first substrate and interconnects extending through at least a portion of the first substrate. The interconnects are electrically coupled to the contact pads on the backside of the first substrate and the image sensors. The microelectronic imager assembly of this embodiment further includes a second substrate having a plurality of optics elements aligned with corresponding image sensors, and a spacer having a first portion attached to the first substrate and a second portion attached to the second substrate. The spacer has openings arranged in a pattern such that individual openings are aligned with (a) a corresponding image sensor and (b) a corresponding optics element.

Another embodiment of a microelectronic imager assembly in accordance with the invention comprises a first substrate having (a) a first imaging unit including a first microelectronic imager and a first array of external contacts electrically coupled to the first image sensor, and (b) a second imaging unit including a second microelectronic image sensor and a second array of external contacts electrically coupled to the second image sensor. This embodiment of a microelectronic imager assembly further includes a first optics element fixed relative to the first imaging unit in alignment with the first microelectronic imager, and a second optics element fixed relative to the second imaging unit in alignment with the second microelectronic image sensor.

Still another embodiment of a microelectronic imager assembly in accordance with the invention comprises an imager workpiece including (a) a first substrate having a front side and a back side, (b) a first imaging unit including a first microelectronic image sensor at the front side of the first substrate and a first array of external contacts at the backside of the first substrate coupled to the first image sensor, and (c) a second imaging unit including a second microelectronic image sensor at the front side of the first substrate and a second array of external contacts at the backside of the first substrate coupled to the second image sensor. The microelectronic imager assembly of this embodiment further includes a first optics element fixed relative to the first imaging unit in alignment with the first microelectronic image sensor, and a second optics element fixed relative to the second imaging unit in alignment with the second microelectronic image sensor.

Another embodiment of a microelectronic imager assembly in accordance with the invention comprises an imaging workpiece having a first substrate and a plurality of microelectronic imaging means formed in and/or on the first substrate. This embodiment further includes an optical device workpiece having a second substrate fixedly coupled to the first substrate. The optical device workpiece has a plurality of optical device means in and/or on the second substrate in alignment with corresponding imaging means of the imager workpiece.

3. Summary of Selected Microelectronic Imagers

Another aspect of the invention is directed toward microelectronic imagers. One embodiment of a microelectronic imager in accordance with the invention comprises an imaging unit including a die having a front side and a backside, an image sensor at the front side of the die, an integrated circuit electrically coupled to the image sensor, a plurality of through-wafer interconnects electrically coupled to the integrated circuit and a plurality of contact pads at the backside of the die. The interconnects extend through the die to the backside, and the contact pads are connected to the interconnects. The microelectronic imager further comprises an optical device fixed with respect to the imaging unit. The optical device has an optics element aligned with the image sensor.

Another embodiment of a microelectronic imager comprises an imaging unit including a die having a front side and a backside, an image sensor at the front side of the die, an integrated circuit electrically coupled to the image sensor, a plurality of interconnects electrically coupled to the integrated circuit and a plurality of contact pads at the backside of the die connected to the interconnects. The microelectronic imager further includes a stand-off projecting from the die and having an opening aligned with the image sensor, and an optical device attached to the stand-off. The optical device has a substrate and an optics element on and/or in the substrate aligned with the image sensor.

Still another embodiment of a microelectronic imager comprises an imaging unit and an optical device fixed with respect to the imaging unit. The imaging unit can include a die having a front side and a backside, an image sensor at the front side of the die, and a plurality of contact pads at the backside of the die. The contact pads are operatively coupled to the image sensor for electrically attaching the imager to an external device. The optical device includes an optics element aligned with the image sensor.

Specific details of several embodiments of the invention are described below with reference to CMOS imagers to provide a thorough understanding of these embodiments, but other embodiments can use CCD imagers or other types of imagers. Several details describing structures or processes that are well known and often associated with other types of microelectronic devices are not set forth in the following description for purposes of brevity. Moreover, although the following disclosure sets forth several embodiments of different aspects of the invention, several other embodiments of the invention can have different configurations or components than those described in this section. As such, it should be understood that the invention may have other embodiments with additional elements or without several of the elements described below with reference to FIGS. 2-23P.

The individual steps of the wafer-level packaging process 200 set forth above with respect to FIG. 2 and microelectronic imagers that are packaged at the wafer level are described below in detail. More specifically, the imaging unit fabrication procedure 202 is described in more detail under heading B entitled "Imager Workpieces With Backside Electrical Contacts," the optics fabrication procedure 204 is described in more detail below under heading C entitled, "Optical Device Workpieces for Microelectronic Imagers," and the assembly procedure 206 is described in greater detail under heading D entitled, "Wafer-level Packaging of Microelectronic Imagers." Additionally, several embodiments of specific microelectronic imagers are also described throughout these sections.

B. Imager Workpieces with Backside Electrical Contacts

Figure 3:
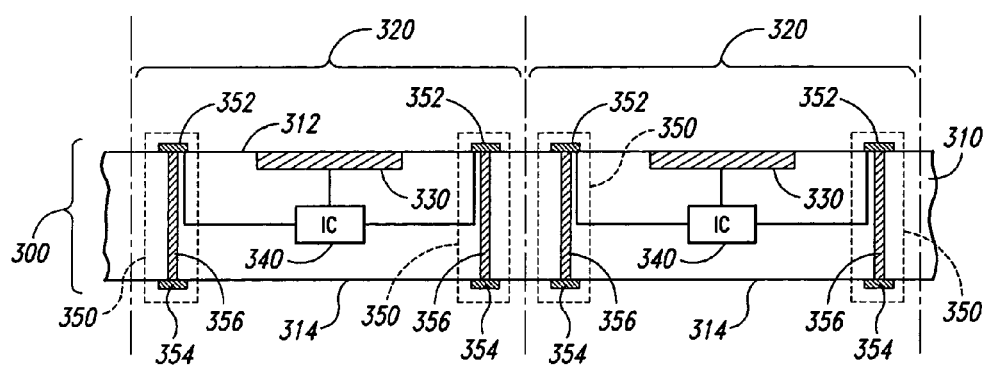
FIG. 3 is a side cross-sectional view schematically illustrating a portion of an imager workpiece having a plurality of imaging units in accordance with an embodiment of the invention suitable for wafer-level packaging of microelectronic imagers.

FIG. 3 is a side cross-sectional view schematically showing a portion of an imager workpiece 300 fabricated in accordance with an embodiment of the imaging unit fabrication procedure 202 (FIG. 2) described above. The imager workpiece 300 has a first substrate 310 and a plurality of imaging units 320 formed on and/or in the first substrate 310. The first substrate 310 has a front side 312 and a backside 314. The first substrate 310 is generally a semiconductor wafer, and the imaging units 320 are microelectronic dies arranged in a die pattern on the wafer. Individual imaging units 320 can include an image sensor 330, integrated circuitry (IC) 340 coupled to the image sensor 330, and external contacts 350 electrically coupled to the integrated circuitry 340. The image sensors 330 can be CMOS image sensors or CCD image sensors for capturing pictures or other images in the visible spectrum, but the image sensor 330 can detect radiation in other spectrums (e.g., IR or UV ranges). The image sensors 330 are typically located at the first side 312 of the substrate 310.

The external contacts 350 shown in FIG. 3 provide arrays of contact pads 354 within the footprint of each imaging unit 320. The contact pads 354 in each array are operatively coupled to a corresponding image sensor 330 via the integrated circuitry 340. Each external contact 350, for example, can include a terminal 352 (e.g., bond-pad), an external contact pad 354 (e.g., ball-pad), and an interconnect 356 coupling the terminal 352 to the contact pad 354. In the embodiment shown in FIG. 3, the terminals 352 are on the front side 312 of the first substrate 310, the contact pads 354 are on the backside 314 of the first substrate 310, and the interconnects 356 are through-wafer interconnects that extend completely through the first substrate 310 to couple the terminals 352 to the contact pads 354. In other embodiments, however, the imaging units 320 may not include the terminals 352 on the front side 312 of the first substrate 310 such that the integrated circuitry 340 is coupled directly to the contact pads 354 on the backside 314 of the substrate 310 by through-wafer interconnects that extend through only a portion of the substrate 310.

The interconnects 356 enable the contact pads 354 to be on the backside 314 of the first substrate 310, which provides several advantages. More specifically, the external contact pads 354 can be located on the backside 314 of the first substrate 310 because the embodiment of the interconnects 356 shown in FIG. 3 are through-wafer interconnects that extend to the backside 314 of the first substrate 310. The backside arrays of external contact pads 354 allow the imaging units 320 to be attached directly to an external device without an interposer substrate. As such, the terminals 352 on the front side 312 of the first substrate 310 are not wire-bonded to a separate interposer substrate as in the prior art. This allows optical devices to be constructed or otherwise assembled directly onto the first substrate 310 at the wafer level before cutting the first substrate 310. It also allows the imaging units 320 and the packaged imagers to be tested from the backside of the die, and it results in smaller packages. These advantages and others are described in greater detail below. Therefore, the backside contact pads 354 enable microelectronic imagers to be packaged using wafer-level packaging processes that are not possible with imagers of the prior art.

FIGS. 4A-9 illustrate several embodiments of methods for forming the electrically conductive through-wafer interconnects 356 shown in FIG. 3. More specifically, FIGS. 4A-9 are schematic side cross-sectional views showing the fabrication of a single external contact 350 shown in FIG. 3, but in practice a plurality of through-wafer interconnects are constructed for all of the imaging units 320 on an imager workpiece. As such, like reference numbers refer to like components in FIGS. 3-9.

FIGS. 4A-4J illustrate a method of forming a through-wafer interconnect for use in the imaging unit 320 in accordance with an embodiment of the invention. In this embodiment, a first dielectric layer 410 is applied to the first side 312 of the first substrate 310, and a second dielectric layer 420 is applied over the first dielectric layer 410. The second dielectric layer 420 is patterned and etched to expose the terminal 352. After exposing the terminal 352, a first hole 422 is formed through the terminal 352. The first hole 422 can be formed by etching the center of the terminal 352, but in other embodiments the first hole 422 can be formed using other suitable methods (e.g., laser).

Figure 4A:
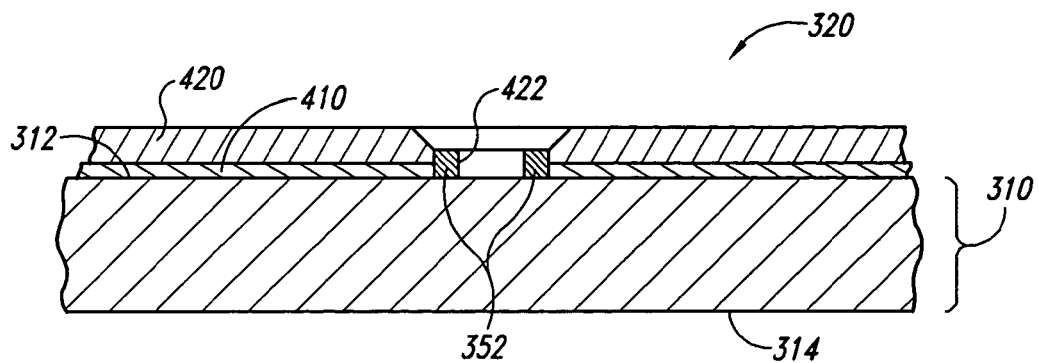
FIGS. 4A-4J are schematic side cross-sectional views illustrating a method for forming an electrically conductive through-wafer interconnect for providing a backside array of contact pads in accordance with an embodiment of the invention for use in wafer-level packaging of microelectronic imagers.
Figure 4B:
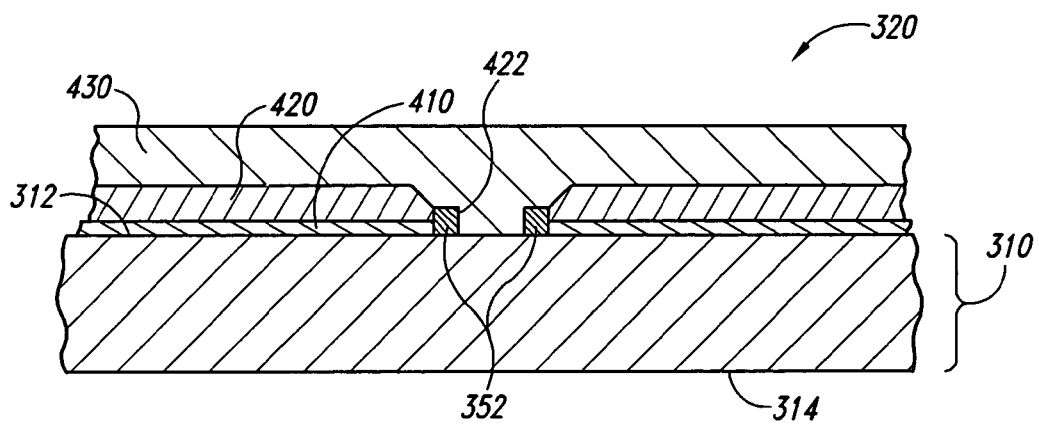

Referring now to FIG. 4B, a third dielectric layer 430 is deposited onto the imaging unit 320 to cover the terminal 352 and fill the first hole 422. The dielectric layers 410/420/430 can be a polyimide material, but these dielectric layers can be other nonconductive materials in other embodiments. For example, the first dielectric layer 410 and/or one or more of the subsequent dielectric layers can be a low temperature chemical vapor deposition (low temperature CVD) material, such as tetraethylorthosilicate (TEOS), parylene, silicon nitride ($Si_3N_4$), silicon oxide ($SiO_2$), and/or other suitable materials. The foregoing list of dielectric materials is not exhaustive. The dielectric layers 410/420/430 are not generally composed of the same material, but two or more of these layers can be composed of the same material. In addition, one or more of the layers described above with reference to FIGS. 4A and 4B, or described below with reference to subsequent figures, may be omitted.

Figure 4C:
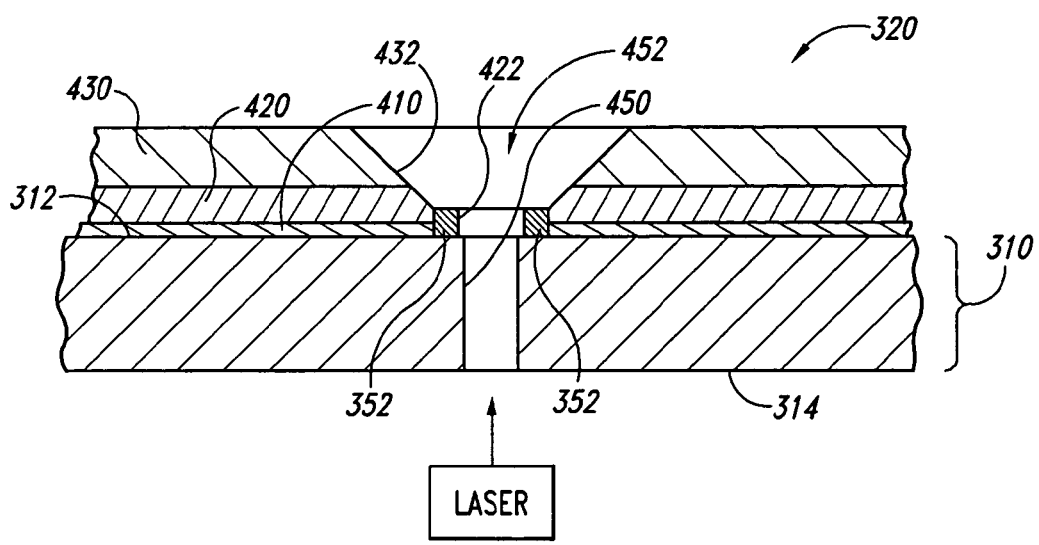

FIGS. 4C-4J show the imaging unit 320 in subsequent stages of forming a through-wafer interconnect. Referring to FIG. 4C, a second hole 432 is etched through the third dielectric layer 430 to expose the terminal 352. The second hole 432 is typically etched to the front side 312 of the first substrate to open the first hole 422. A passage or through-hole 450 is then cut through the first substrate 310. The through-hole 450 extends through the first substrate 310 to the first hole 422 in the terminal 352. The through-hole 450 and the first hole 422 together form a passage 452 extending through the imaging unit 320. The through-hole 450 can be formed using a laser (shown schematically) to cut through the first substrate 310 from the second side 314 toward the first side 312. In a different embodiment, the laser can conceivably cut from the first side 312 toward the second side 314. The laser can be aligned with respect to the terminal 352 using scanning/alignment systems known in the art. In other embodiments, the through-hole 450 can be etched through the first substrate 310 if the first substrate 310 is not too thick.

After forming the through-hole 450, it is cleaned to remove ablated byproducts (i.e., slag) and/or other undesirable byproducts resulting from the laser. The through-hole 450 can be cleaned using a wet-etch process. In the embodiment shown in FIG. 4C, the cross-sectional dimension of the through-hole 450 is less than the cross-sectional dimension of the first hole 422 so that the laser does not impinge against the terminal 352. This avoids producing slag of one material in the first hole 422 (i.e., metal from the terminal 352) and slag of a different material in the through-hole 450 (i.e., silicon from the first substrate 310). This feature allows a single cleaning process/chemistry to clean the slag from the through-hole 450 without having to use a second cleaning process to clean residue from the first hole 422. It is generally desirable to use cleaning agents that do not attack the metal of the terminal 352 to clean slag from the through-hole 450. Suitable cleaning agents, for example, include 6% tetramethylammonium hydroxide (TMAH): propylene glycol. The slag in the through-hole 450, however, may not be cleaned in some embodiments of this method.

Figure 4D:
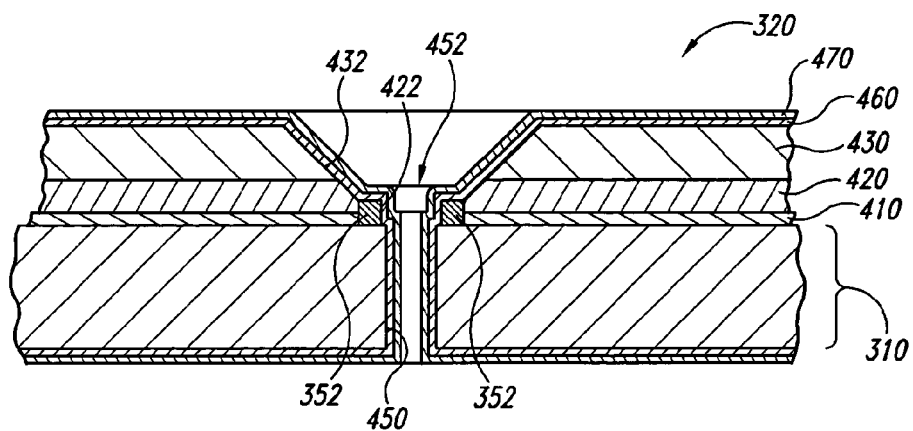

Referring to FIG. 4D, a fourth dielectric layer 460 is applied to the imaging unit 320 to line the sidewall of the through-hole 450 in the first substrate 310. The fourth dielectric layer 460 can be applied using CVD, PVD, ALD or other deposition processes. In the illustrated embodiment the fourth dielectric layer 460 not only lines the exposed portions of the first substrate 310 in the through-hole 450, but it also covers the terminal 352 and the third dielectric layer 430. The fourth dielectric layer 460 can be a low temperature CVD oxide, but in other embodiments the fourth dielectric layer 460 can be other suitable dielectric materials. The fourth dielectric layer 460 electrically insulates the components of the first substrate 310 from an interconnect that is subsequently formed in the passage 452 as described in greater detail below.

After applying the fourth dielectric layer 460, a first conductive layer 470 is deposited onto the imaging unit 320. In the illustrated embodiment, the first conductive layer 470 covers the fourth dielectric layer 460. The first conductive layer 470 is generally composed of a metal, such as TiN, but in other embodiments the first conductive layer 470 can be composed of TaN, W, Ta, Ti, Al, Cu, Ag, Au, Ni, Co and/or other suitable materials known to those of skill in the art. When the first conductive layer 470 is composed of TiN, it can be formed using $TiCl_4TiN$ and an atomic layer deposition or chemical vapor deposition process. As explained below, the first conductive layer 470 provides a seed layer for plating another layer of metal into the passage 452.

Figure 4E:
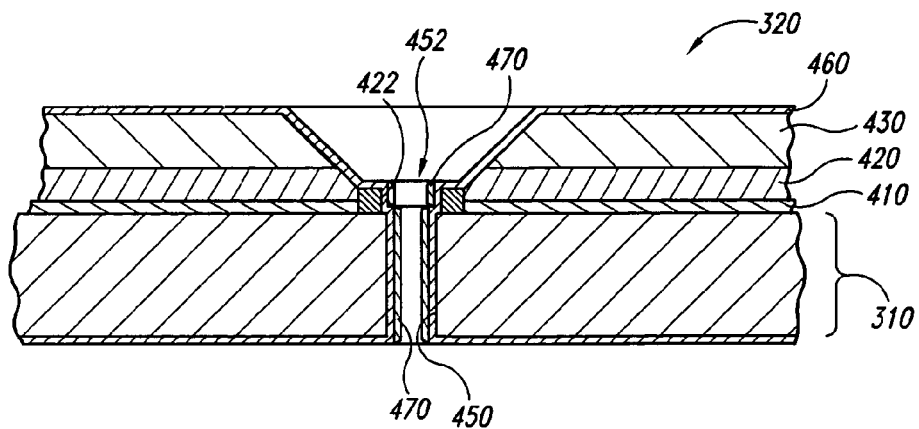

Referring next to FIG. 4E, the first conductive layer 470 is etched to leave a portion of the first conductive layer 470 lining the passage 452. The first conductive layer 470 can be etched using a "dry etch" or "spacer etch" that preferentially removes material from surfaces that are transverse (i.e., not parallel) relative to the direction of the etchant. In this embodiment, the vertical portions of the first conductive layer 470 remain on the fourth dielectric layer 460 in the holes 422 and 450 to line the passage 452.

Figure 4F:
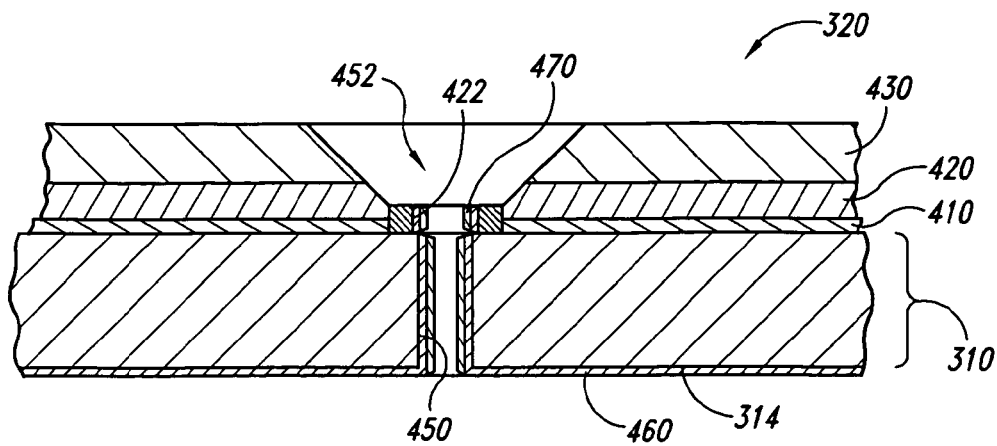
Figure 4G:
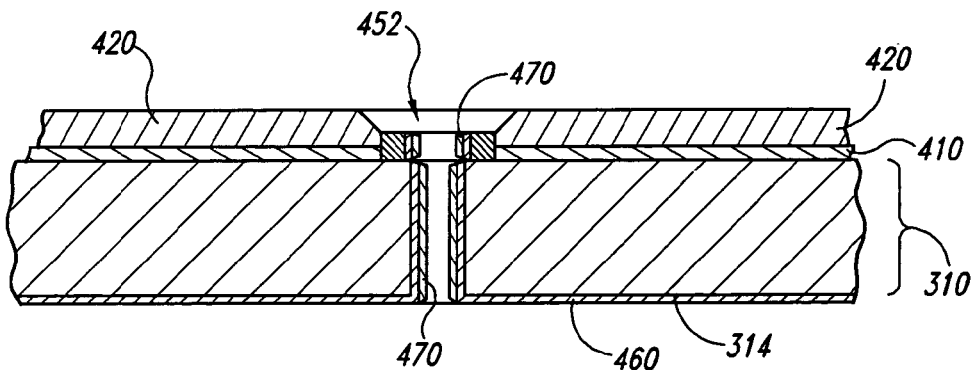

Referring next to FIGS. 4F and 4G, the front side of the fourth dielectric layer 460 is etched to remove the fourth dielectric layer 460 from the horizontal and diagonal surfaces of the first side 312 of the imaging unit 320 (FIG. 4F), and then the third dielectric layer 430 is removed from the imaging unit 320 (FIG. 4G). The fourth dielectric layer 460 remains under the first conductive layer 470 in the passageway 452 and on the second side 314 of the first substrate 310 in this embodiment. The fourth dielectric layer 460 can be etched using a dry etch or spacer etch as described above. The third dielectric layer 430 can be removed using a suitable isotropic or anisotropic etch, a washing process, or a CMP process depending on the composition of the third dielectric layer 430.

Figure 4H:
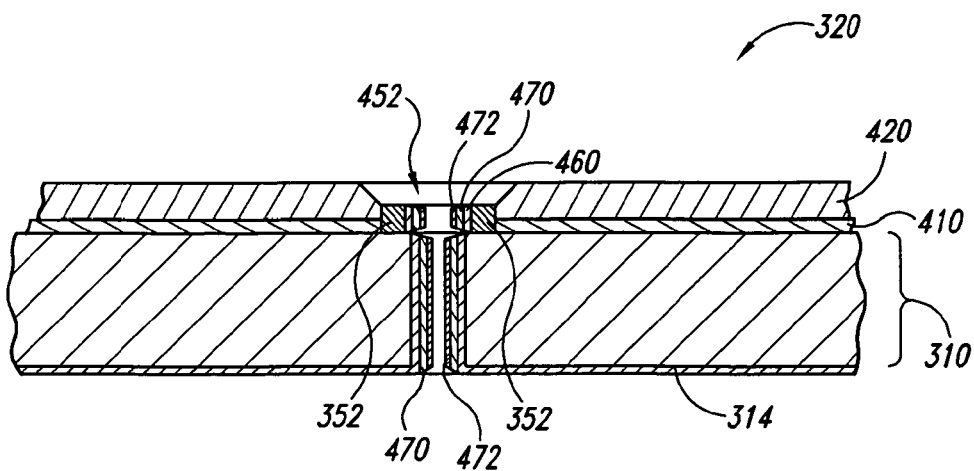

Referring to FIG. 4H, a second conductive layer 472 is deposited onto the remaining portions of the first conductive layer 470 in the holes 422 and 450. The second conductive layer 472 is generally a wetting agent to facilitate depositing metals into the passage 452. In one embodiment, the second conductive layer 472 is Ni and the first conductive layer 470 is TiN so that the Ni can be plated onto the TiN using an electroless plating operation. More specifically, when the TiN is activated by an HF:Pd wet dip, it provides nucleation for the Ni during the plating process. The plating process may also be performed using an activationless Ni chemistry with reduced stabilizer content. The TiN can enhance the adhesion and electrical properties to induce nucleation. In other embodiments, the passage 452 can be coated with Cu, Au, or other suitable materials using other methods, or one or more of the first and second conductive layers 470 and 472 may be omitted.

Figure 4I:
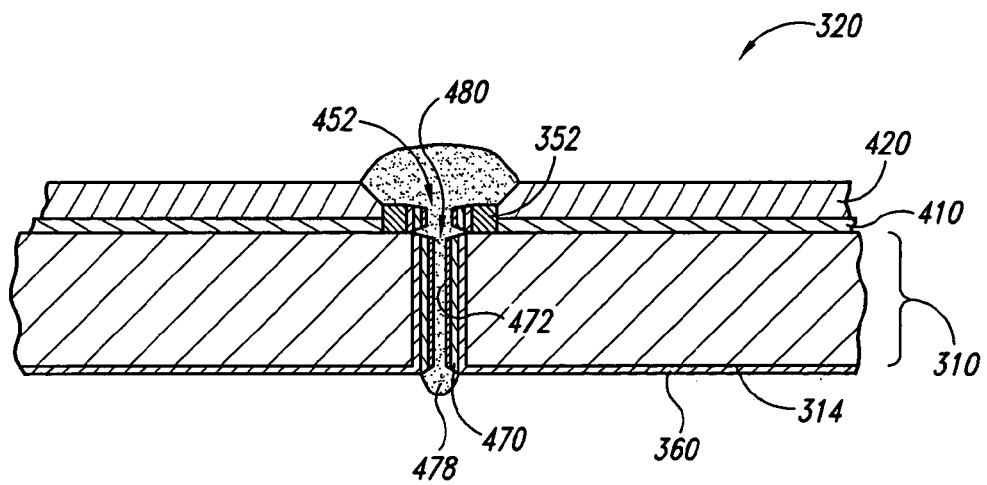

Referring next to FIG. 4I, a conductive fill material 478 is deposited into the passage 452 to form an interconnect 480 extending through the imaging unit 320. In one embodiment, the fill material 478 can be solder, copper, or other electrically conductive materials, and it is deposited into the passage 452 using a solder wave process. The fill material 478 can alternatively be deposited into the passage 452 by electroplating, stenciling, placing a pre-formed sphere of metal fill in the passage 452 and melting the sphere, injecting a flowable material into the passage 452, or other suitable methods known to those of skill in the art.

Figure 4J:
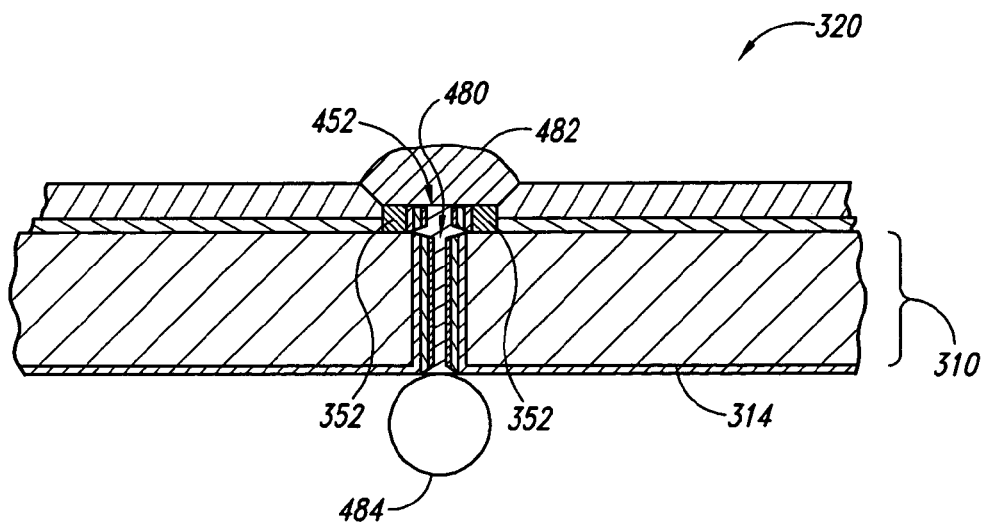

Referring next to FIG. 4J, a cap 482 is formed at one end of the interconnect 480 to electrically couple the interconnect 480 with the terminal 352. In one embodiment, the cap 482 is Ni that is plated onto the interconnect 480. Alternatively, the cap 482 can be omitted by overfilling the passage 452 with the fill material 478 such that the fill material itself forms a connection to the terminal 352. A solder ball 484 or other external interconnect structure can be attached to the interconnect 480 at the second side 314 of the first substrate 310 to provide an external connection to other electronic devices on the backside of the imaging unit 320.

One feature of the method described above with reference to FIGS. 4A-4J is that the passage 452 extends through the entire imaging unit 320. The passage 452 is accordingly easier to clean and fill than would otherwise be the case in certain situations when the passage is "blind" (i.e., a passage that extends only partially through the workpiece). For example, if the passage 452 has an aspect ratio of 25:1; or greater, a blind passage may be difficult to fill with metallic materials using known physical vapor deposition (PVD), atomic level deposition (ALD), or plating processes. The passage 452 mitigates this problem because the open through-hole is not subject to "pinch-off," voids or other phenomena of filling blind holes.

Figure 5A:
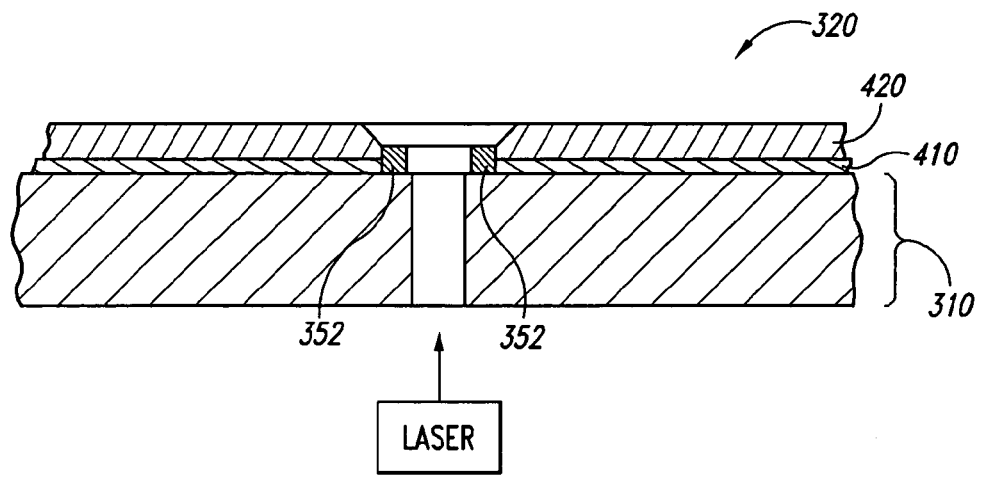
FIGS. 5A-5F are schematic side cross-sectional views illustrating a method for forming an electrically conductive through-wafer interconnect for providing a backside array of contact pads in accordance with an embodiment of the invention for use in wafer-level packaging of microelectronic imagers.

FIGS. 5A-5F illustrate a method of forming a through-wafer interconnect in accordance with another embodiment of the invention. FIG. 5A shows the imaging unit 320 at a point in the process that is similar to the imaging unit 320 illustrated in FIG. 4C. The method shown in FIGS. 5A-5F, however, differ from those described above with reference to FIGS. 4A-4F in that a third dielectric layer is not applied over the second dielectric layer 420 before cutting a through-hole through the first substrate 310. Therefore, referring to FIG. 5A, a through-hole 450 is formed through the first substrate 310 without having the third dielectric layer 430 shown in FIG. 4C over the second dielectric layer 420.

Figure 5B:
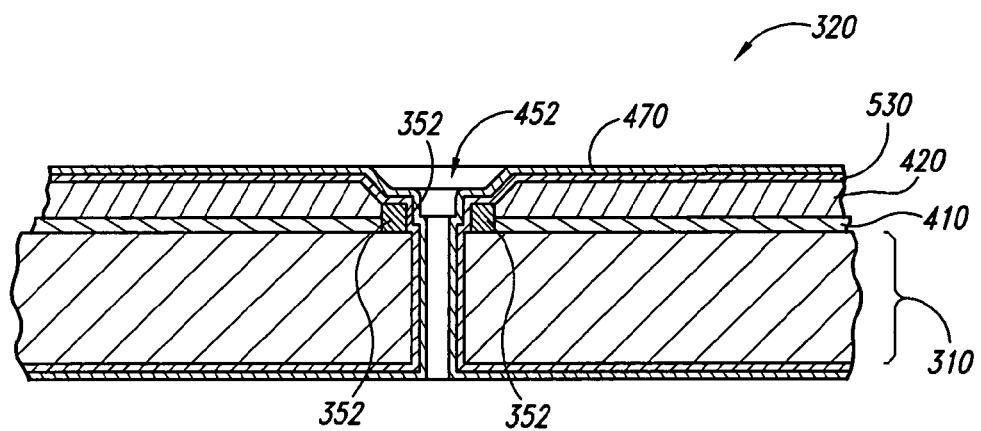

FIG. 5B illustrates additional stages of this method that are generally similar to the steps described above with reference to FIG. 4D. In a further aspect of this embodiment, however, after cleaning the through-hole 450, a third dielectric layer 530 is deposited onto the imaging unit 320 to line the sidewall of the through-hole 450 within the first substrate 310. In practice, the third dielectric layer 530 generally covers the terminal 352 and the second dielectric layer 420 in addition to the sidewall of the through-hole 450. After forming the third dielectric layer 530, the first conductive layer 470 is deposited onto the imaging unit 320.

Figure 5C:
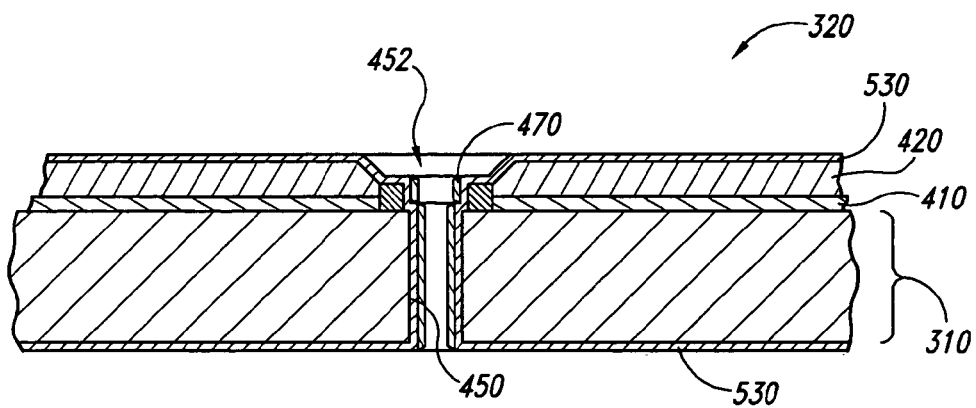
Figure 5D:
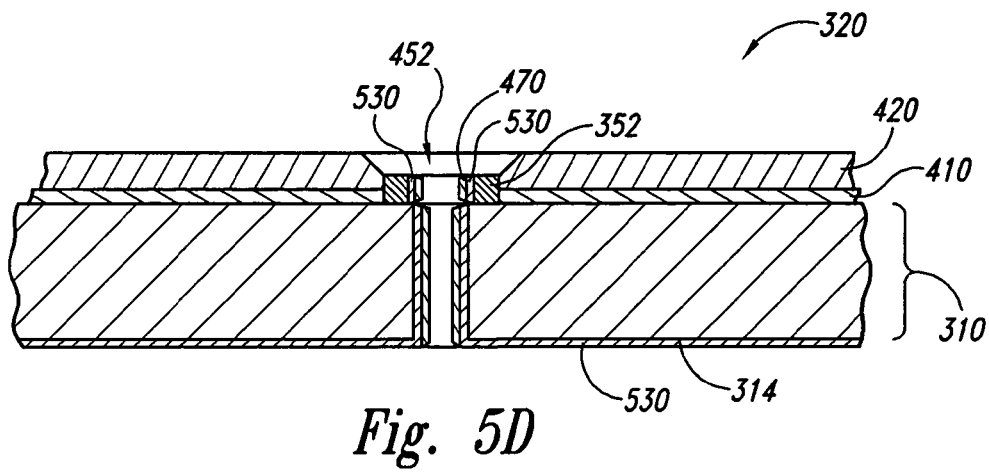

Referring next to FIG. 5C, the first conductive layer 470 is etched from the horizontal and diagonal surfaces of the imaging unit 320 using a spacer etch or other process as described above with respect to FIG. 4E. Referring to FIG. 5D, the third dielectric layer 530 is etched from the upper horizontal and diagonal surfaces of the imaging unit 320 to leave portions of the third dielectric layer 453 in the passageway 452 and on the second side 314 of the first substrate 310. The third dielectric layer 530 is typically etched using another spacer etch. The spacer etch of the third dielectric layer 530 should be terminated before etching through the second dielectric layer 420.

Figure 5E:
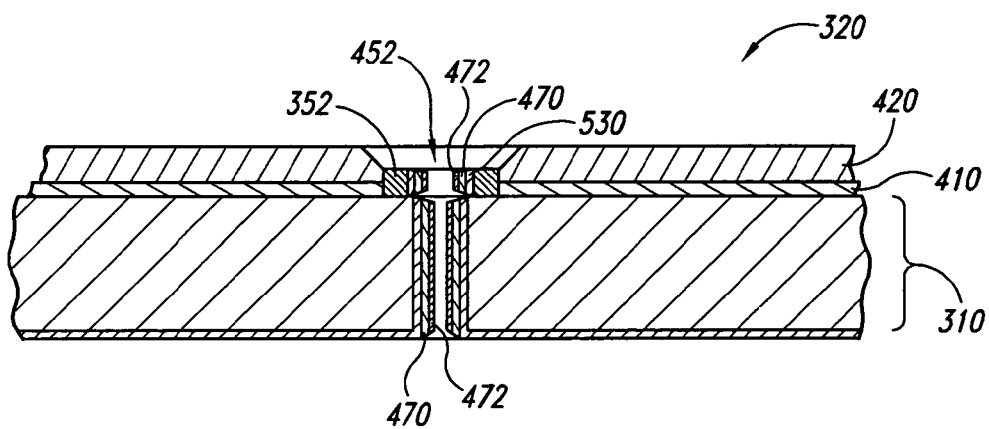
Figure 5F:
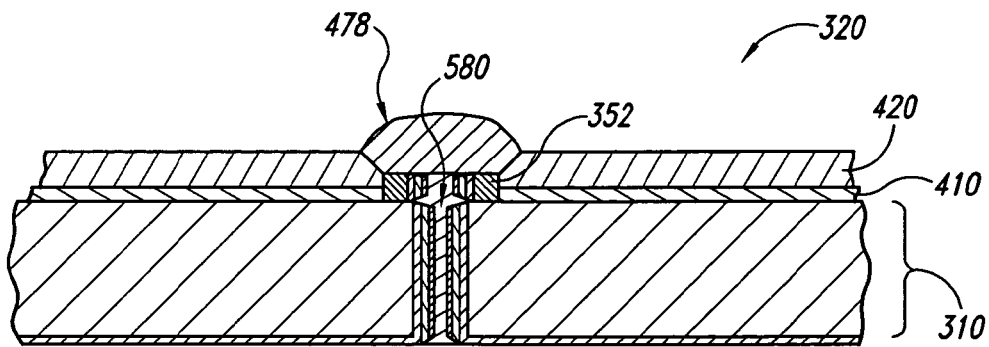

Referring to FIG. 5E, the second conductive layer 472 is then deposited onto the first conductive layer 470, and referring next to FIG. 5F the fill material 478 is deposited into the passageway 452 to construct a through-wafer interconnect 580. The procedure for filling the passageway and forming a cap can be generally similar to that described above with reference to FIGS. 4I-4J.

Figure 6A:
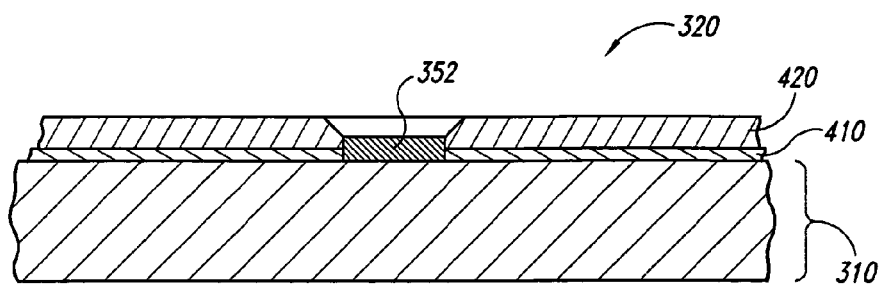
FIGS. 6A and 6B are schematic side cross-sectional views illustrating a method for forming an electrically conductive through-wafer interconnect for providing a backside array of contact pads in accordance with an embodiment of the invention for use in wafer-level packaging of microelectronic imagers.
Figure 6B:
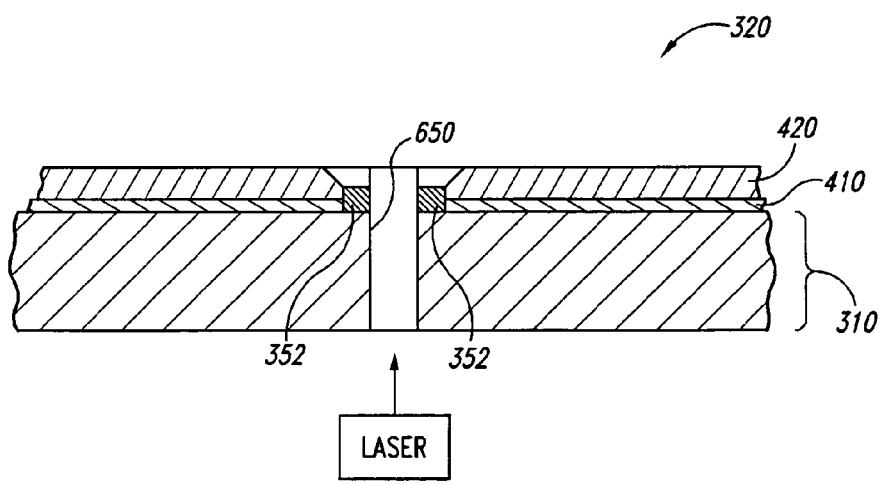

FIGS. 6A and 6B illustrate another method of forming an interconnect in accordance with an embodiment of the invention. Referring first to FIG. 6A, the first part of this method is similar to the steps described above with reference to FIG. 4A, but a hole is not etched in the terminal 352. Referring next to FIG. 6B, a through-hole 650 is formed through both the first substrate 310 and the terminal 352. The through-hole 650 can be formed using a laser (shown schematically), etching, or other suitable processes. When the through-hole 650 is formed using a laser, a first type of slag (i.e., silicon) can coat the portion of the sidewall in the first substrate 310 and a second type of slag (i.e., metal) can coat the portion of the sidewall in the terminal 352. As such, it may take two separate cleaning steps to clean the through-hole 650. In general, the cleaning agents used to clean the through-hole 650 may be limited to chemistries that do not attack or otherwise degrade either the terminal 352 or the first substrate 310. After the through-hole 650 has been suitably cleaned, the imaging unit 320 can undergo additional steps that are at least generally similar to those described above with reference to FIGS. 4C-4J to construct a through-wafer interconnect.

The embodiments described above with reference to FIGS. 4A-6B include three methods for forming and/or filling through-holes in microfeature workpieces that extend through bond-pads and/or associated substrates. In other embodiments, other methods can be used to form and/or fill such through-holes. Accordingly, the present invention is not limited to the particular methods for forming and/or filling the through-holes described above, but it also includes alternative methods for providing an electrically conductive material in a through-hole to form an array of ball-pads on the backside of the imager die.

FIGS. 7A-9 show additional methods for constructing interconnects for the imaging unit 320. The methods shown in FIGS. 7A-7H are related to those of FIGS. 4A-6B, but form an interconnect in a blind hole instead of a through-hole. The methods shown in FIGS. 8A-8F are also related to those of FIGS. 4A-6B, form interconnects from the front side 312 of the first substrate 310 instead of from the backside.

Figure 7A:
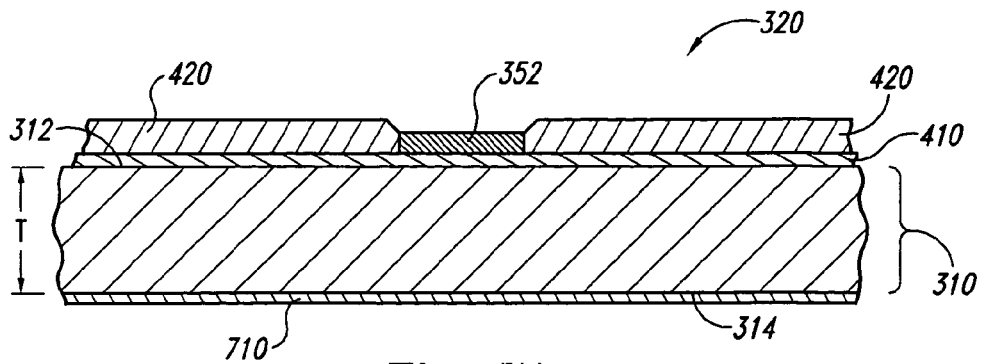
FIGS. 7A-7H are schematic side cross-sectional views illustrating a method for forming an electrically conductive through-wafer interconnect for providing a backside array of contact pads in accordance with an embodiment of the invention for use in wafer-level packaging of microelectronic imagers.

FIGS. 7A-7H illustrate a method of forming an interconnect for the imaging unit 320 (FIG. 3) in accordance with another embodiment of the invention. FIG. 7A, more specifically, is a schematic side cross-sectional view of the area for the external contact 350 shown in FIG. 3. In this embodiment, the first dielectric layer 410 is applied to the first side 312 of the first substrate 310 and the second dielectric layer 420 is applied over the first dielectric layer 410. A portion of the second dielectric layer 420 is removed to expose the terminal 352. The first substrate 310 can be thinned by grinding the backside of the first substrate 310 to form the second side 314 at a desired thickness "T." The substrate thickness T can be approximately 200 μm-1,000 μm, 300 μm-750 μm, or about 500 μm. The second side 314 of the first substrate 310 can be thinned using chemical mechanical planarization (CMP) processes, dry grinding processes, or other suitable grinding procedures.

After the first substrate 310 is thinned to a thickness T, a third dielectric layer 710 is applied over the second side 314 of the first substrate 310. The dielectric layers 410/420/710 can be a polyimide material, but they can alternatively be other non-conductive materials. For example, the dielectric layers 410/420/470 can be composed of low temperature chemical vapor deposition (low temperature CVD) materials, such as tetraethylorthosilicate (TEOS), parylene, silicon nitride ($Si_3N_4$), silicon oxide ($SiO_x$), and/or other suitable materials. The dielectric layers 410/420/710 are generally not composed of the same material as each other, but it is possible that two or more of these layers are composed of the same material. In addition, one or more of the layers described above with reference to FIG. 7A may be omitted.

Figure 7B:
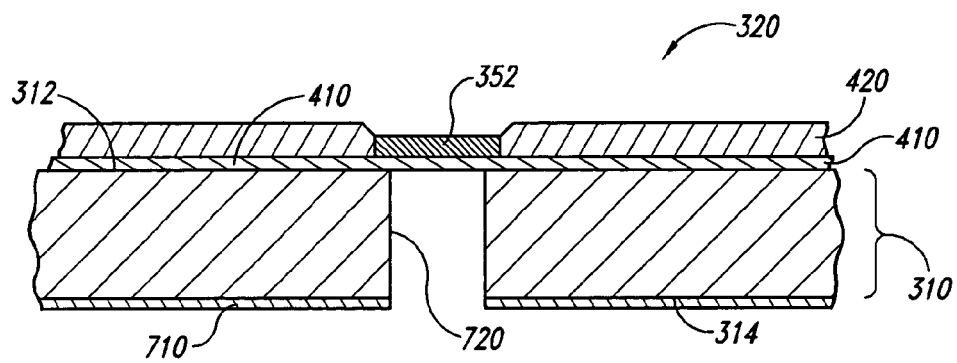

FIGS. 7B-7H illustrate subsequent stages of forming this embodiment of the interconnect. FIG. 7B, for example, is a schematic side cross-sectional view of the imaging unit 320 after a hole or aperture 720 has been formed through the first substrate 310 in alignment with a corresponding terminal 352. The hole 720 is formed by patterning the second side 314 of the first substrate 310 and etching through the first substrate 310 from the second side 314. The hole 720 can be etched using a process that selectively removes material from the first substrate 310 compared to the first dielectric layer 410. The first dielectric layer 410 can accordingly be an etch-stop.

Figure 7C:
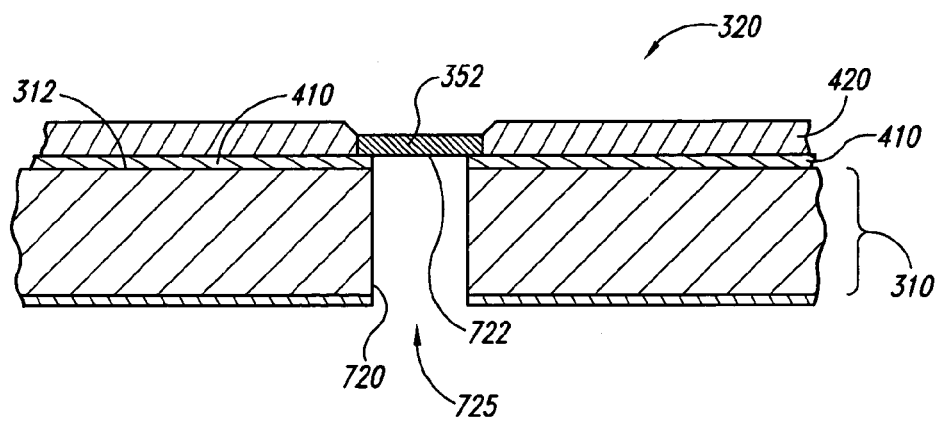

Referring to FIG. 7C, the first dielectric layer 410 directly beneath the terminal 352 is etched to expose a backside 722 of the terminal 352. The hole 720 and the exposed backside 722 of the terminal 352 define a blind hole 725. For purposes of this specification, a "blind hole" refers to a hole or aperture that extends only partially through the imaging unit 320 or is otherwise closed at one end. The second etching process for the first dielectric layer 410 can be different than the first etching process for the first substrate 310. For example, the second etching process can selectively remove material from the first dielectric layer 410 at a higher etch rate than from either the first substrate 310 or the terminal 352. The second etching process accordingly does not alter the general structure of the terminal 352 and/or the first substrate 310. In an alternative embodiment, the first substrate 310 and the first dielectric layer 410 can be etched using a single etch to form the hole 720.

The hole 720 can alternatively be formed using a laser in addition to or in lieu of etching. If a laser is used to form all or a portion of the hole 720, it is typically cleaned using chemical cleaning agents to remove slag or other contaminants. Although laser cutting the hole 720 may be advantageous because the first substrate 310 does not need to be patterned, etching the hole 720 may be easier because slag does not need to be cleaned from the hole 720. Another advantage of etching the hole 720 is that the hole 720 has rounded corners, which reduces stress points within the hole so that an interconnect constructed within the hole 720 is less susceptible to stress damage. A further advantage of using an etching process is that the second side 314 of the first substrate 310 can be patterned and etched to simultaneously form a plurality of holes 720 aligned with corresponding terminals 352. Accordingly, etching the holes 720 may be more efficient than using a laser because the laser must be realigned with individual terminals 352 before it cuts each hole.

Figure 7D:
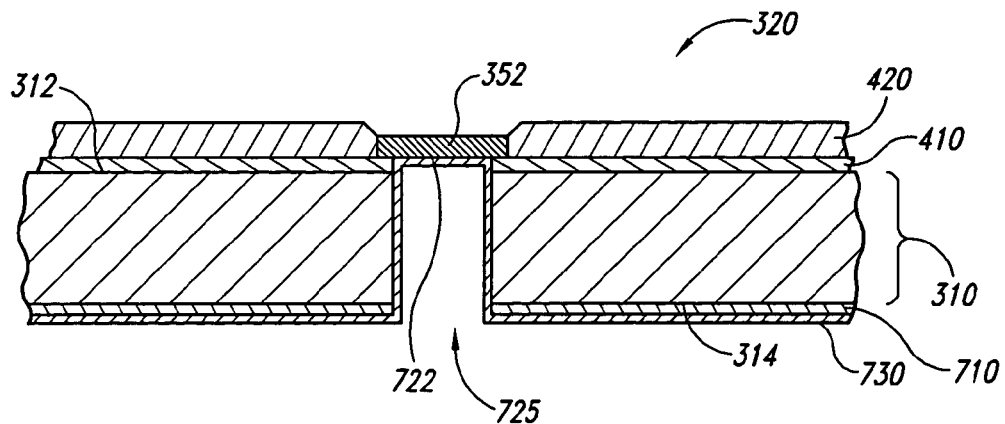

Referring to FIG. 7D, a fourth dielectric layer 730 is applied to the imaging unit 320 to line the sidewall of the blind hole 725. In the illustrated embodiment the fourth dielectric layer 730 also covers the backside 722 of the terminal 352 and the third dielectric layer 710. The fourth dielectric layer 730 can be a low temperature CVD oxide or other suitable dielectric materials.

Figure 7E:
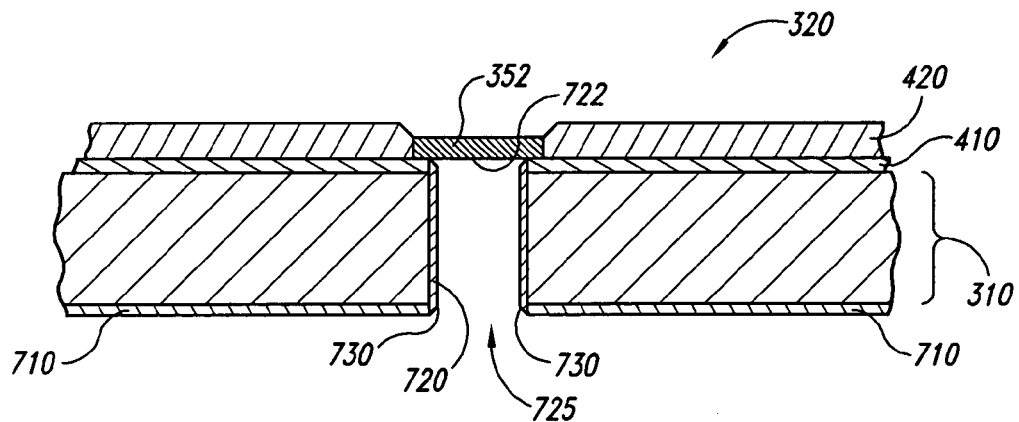

Referring next to FIG. 7E, the fourth dielectric layer 730 is etched from the horizontal and diagonal surfaces of the imaging unit 320 using a spacer etch or dry etch. This leaves portions of the fourth dielectric layer 730 lining the sidewall of the blind hole 725 to electrically insulate components in the first substrate 310 from conductive materials subsequently deposited into the blind hole 725.

Figure 7F:
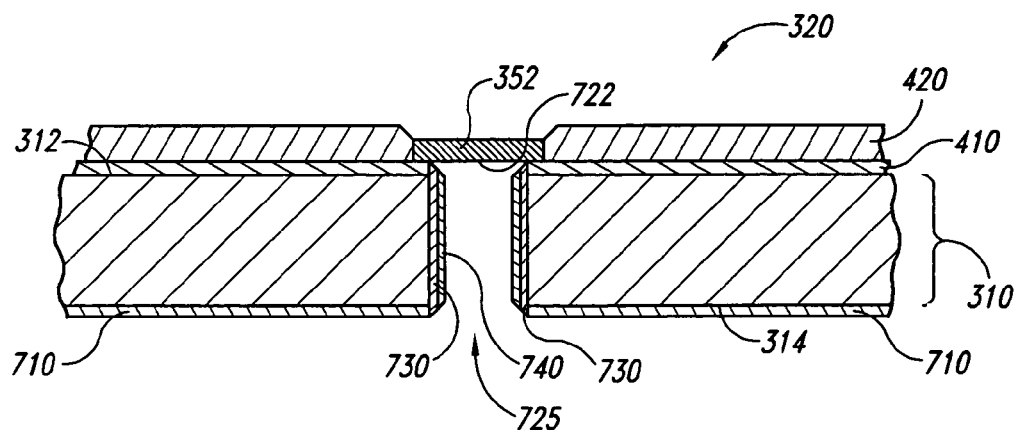

Referring next to FIG. 7F, a first conductive layer 740 is deposited onto the imaging unit 320 and then etched to cover the portion of the fourth dielectric layer lining the sidewall of the blind hole 725. In the illustrated embodiment, the first conductive layer 740 is deposited over the second side 314 of the imaging unit 320 so that it covers the third dielectric layer 710, the fourth dielectric layer 730, and the backside 722 of the terminal 352. The first conductive layer 740 is generally composed of a metal, such as TiN, but in other embodiments the first conductive layer 740 can be composed of other suitable materials. The first conductive layer 740 is then etched from the horizontal and diagonal surfaces of the imaging unit 320 using a spacer etch to leave the remaining portions of the first conductive layer 740 on the fourth dielectric layer 730 in the blind hole 725.

Figure 7G:
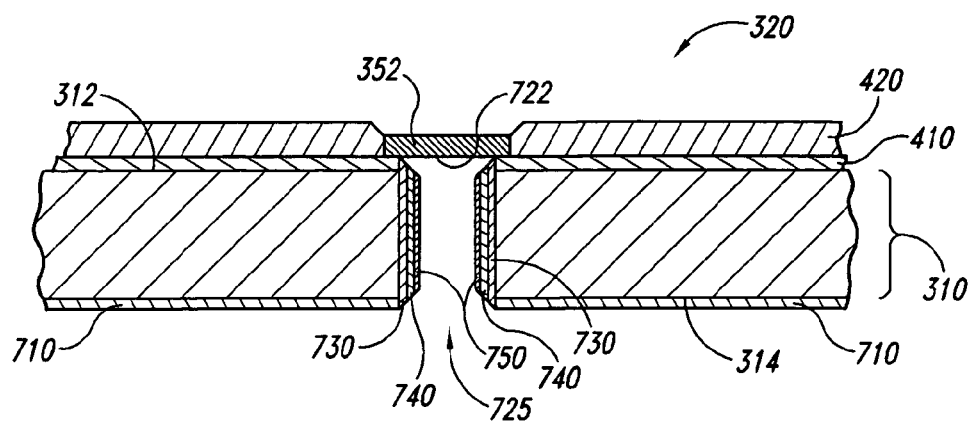

Referring to FIG. 7G, a second conductive layer 750 is deposited onto the remaining portions of the first conductive layer 740 in the blind hole 725. The second conductive layer 750 is a wetting agent that facilitates depositing subsequent metals into the blind hole 725. The second conductive layer 750 can be Ni that is deposited onto a first conductive layer 740 composed of TiN in an electroless plating operation. When the TiN is activated by an HF:Pd wet dip, it provides nucleation for the Ni during the plating process. In other embodiments, the blind hole 725 can be coated with Cu or other suitable materials using other methods, or one or more of the first and second conductive layers 740 and 750 may be omitted.

Figure 7H:
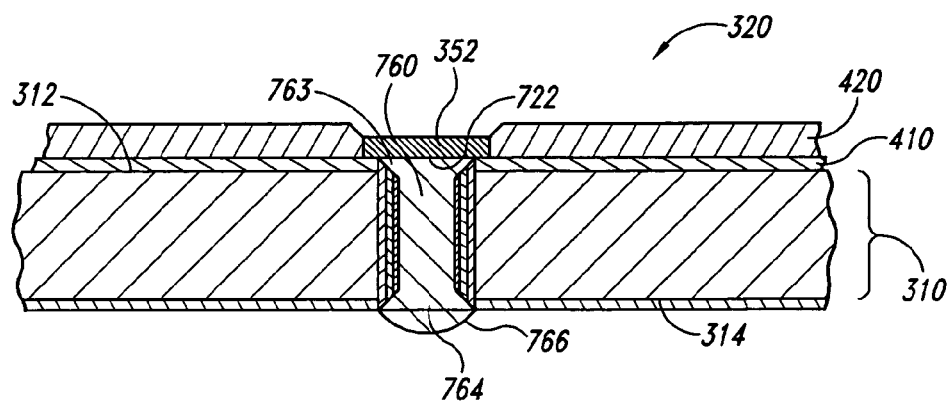

Referring next to FIG. 7H, a conductive fill material is deposited into the blind hole 725 to form an interconnect 760 extending through the imaging unit 320. The fill material can be solder, copper, or other electrically conductive fill materials. The fill material can be deposited into the blind hole 725 using a solder wave process, but in other embodiments the fill material can be deposited using electroplating, electroless plating, or other suitable methods.

The interconnect 760 has a first end 763 contacting the backside 722 of the terminal 352 and a second end 764 at the second surface 314 of the first substrate 310. A cap 766 can be formed at the second end 764 of the interconnect 760 after depositing the fill material. In one embodiment, the cap 766 can be Ni electroplated onto the interconnect 760. In other embodiments, the cap 766 can be a wetting agent and/or other material. A solder ball (not shown) can then be attached to the interconnect 760 at the second side 314 of the first substrate 310 to provide an external connection to other electronic devices on the backside of the imaging unit 320.

Figure 8A:
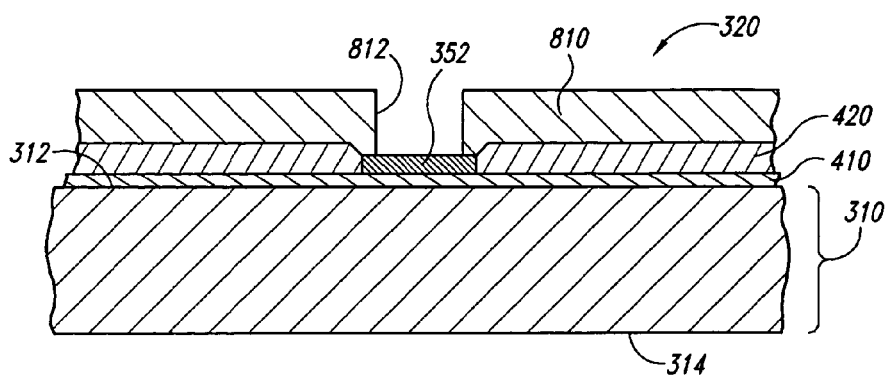
FIGS. 8A-8F are schematic side cross-sectional views illustrating a method for forming an electrically conductive through-wafer interconnect for providing a backside array of contact pads in accordance with an embodiment of the invention for use in wafer-level packaging of microelectronic imagers.

FIGS. 8A-8F illustrate a method of forming a through-wafer interconnect for the imaging unit 320 in accordance with another embodiment of the invention. This method begins with the first substrate 310, the first dielectric layer 410, the second dielectric layer 420, and the terminal 352 as shown in FIG. 7A. The process shown in FIGS. 8A-8F, however, differs from the method shown in FIGS. 7A-7H in that a hole or aperture is formed from the first side 312 of the first substrate 310 instead of the second side 314. As such, a mask 810 is applied over the second dielectric layer 420 and patterned as shown in FIG. 8A. The mask 810 can be a layer of resist that is patterned according to the arrangement of terminals 352. As such, the mask 810 has openings over the terminal 352.

Figure 8B:
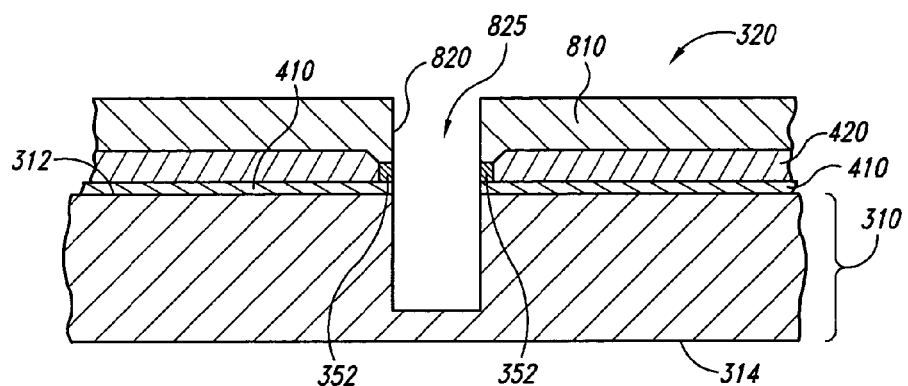

Referring to FIG. 8B, a hole or aperture 460 is formed through at least part of the first substrate 310. The hole 820 extends through the terminal 352, the first dielectric layer 410, and a portion of the first substrate 310 defining a blind hole 825. The hole 820 is formed by etching through the materials using one or more individual etches. The hole 820 can alternatively be formed using a laser in addition to or in lieu of etching.

Figure 8C:
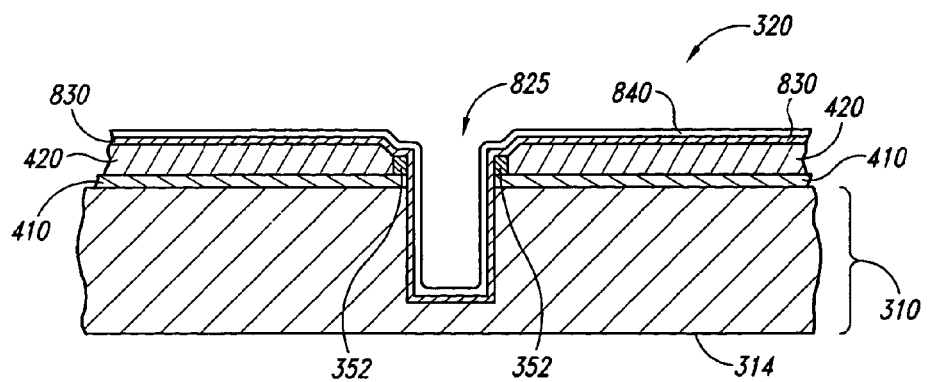

Referring next to FIG. 8C, a third dielectric layer 830 is deposited onto the imaging unit 320 to line the sidewall of the blind hole 825 within the substrate 310. In practice, the third dielectric layer 830 generally covers the second dielectric layer 420 and the terminal 352 in addition to lining the sidewalls of the blind hole 825. In this embodiment, a first conductive layer 840 is then deposited onto the third dielectric layer 830. The first conductive layer 840 can be composed of TiN, Cu or other suitable materials.

Figure 8D:
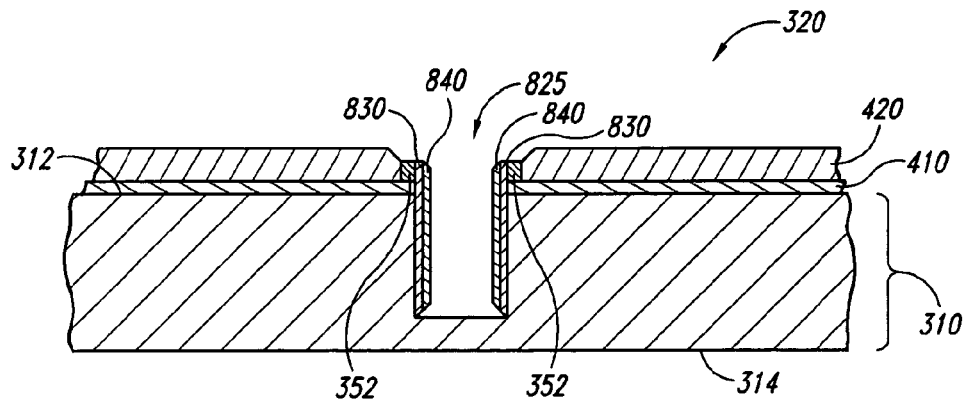

Referring next to FIG. 8D, the first conductive layer 840 and the third dielectric layer 830 are etched from the horizontal and diagonal surfaces of the imaging unit 320 using one or more spacer etches. This leaves a portion of the third dielectric layer 830 lining the sidewall of the blind hole 825 and a portion of the first conductive layer 840 on the third dielectric layer 830. In one embodiment, the first conductive layer 840 is etched first using a first spacer etch that does not etch the third dielectric layer 830, and then the third dielectric layer 830 is etched using a second spacer etch that does not etch the first conductive layer 840 in the blind-hole 825.

Figure 8E:
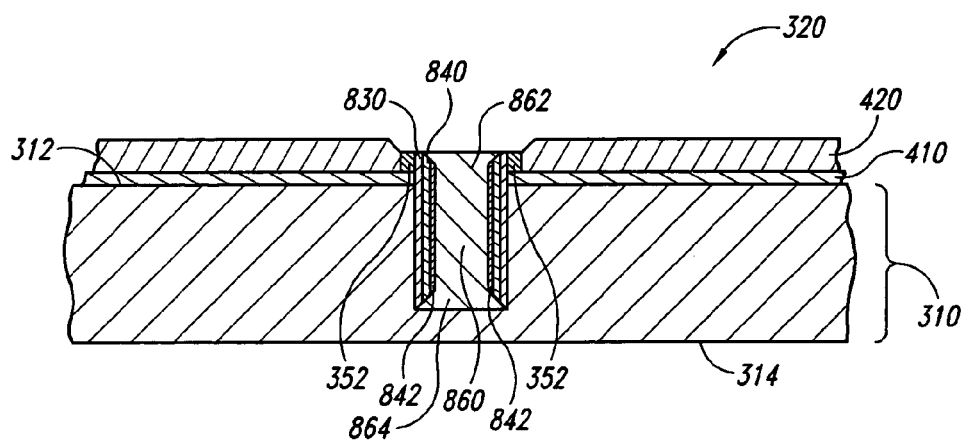

Referring next to FIG. 8E, a second conductive layer 842 is then deposited onto the first conductive layer 840 and the blind hole 825 (FIG. 8D) is filled with a conductive material. The second conductive layer 842 can be a wetting agent to facilitate filling the blind hole with the conductive fill material. The second conductive layer 842 can accordingly be Ni or another suitable material deposited onto the remaining portions of the first conductive layer 840 using an electroless plating process.

A conductive fill material is then deposited into the blind hole to form an interconnect 860 in the imaging unit 320. Solder wave processes, plating processes, vapor deposition processes or other methods can be used to deposit the fill material into the blind hole. The interconnect 860 has a first end 862 proximate to the terminal and a second end 864 at the bottom of the blind hole.

Figure 8F:
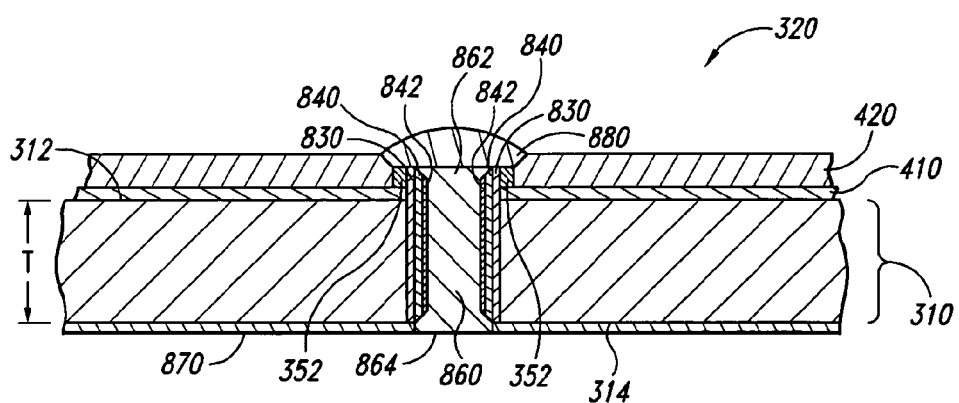

Referring to FIG. 8F, the second side 314 of the first substrate 310 is then thinned using a CMP process. The second side 314 of the first substrate 310 is ground to a thickness T until the second end 864 of the interconnect 860 is exposed. The substrate thickness T can be approximately 200 µm-1,000 µm, 300 µm-750 µm, or about 500 µm. A fourth dielectric layer 870 is applied to the second side 314 of the first substrate 310 and then etched to expose the second end 864 of the interconnect 86, and a cap 880 is formed on the first end 862 of the interconnect 860 to electrically couple the terminal 352 to the interconnect 860.

Figure 9:
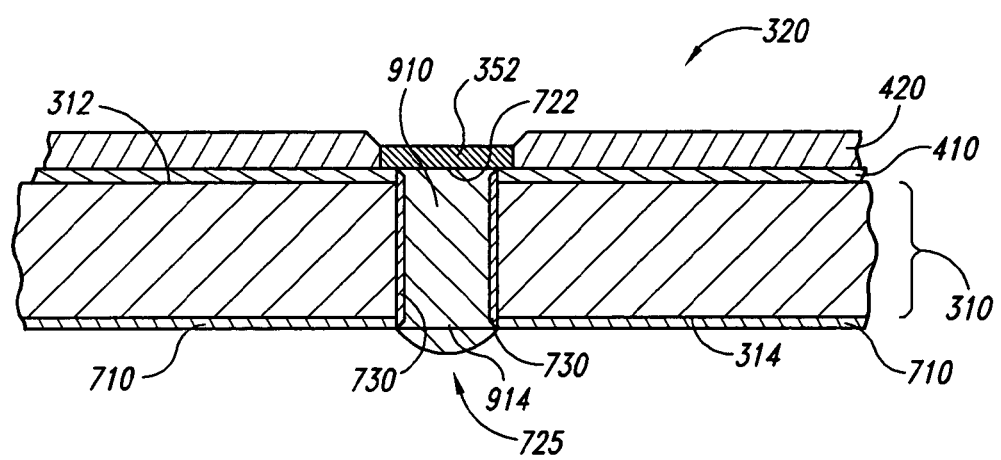
FIG. 9 is a schematic side cross-sectional view illustrating a through-wafer interconnect for providing a backside array of contact pads in accordance with another embodiment of the invention for use in wafer-level packaging of microelectronic imagers.

FIG. 9 illustrates an interconnect 910 in the imaging unit 320 in accordance with another embodiment of the invention. This method is related to the method described above with reference to FIGS. 7A-7E, and many reference numbers in FIG. 9 refer back to those in FIGS. 7A-7E. This method differs from the embodiment described above with reference to FIGS. 7F-7H in that a first conductive layer and a second conductive layer are not deposited into the blind hole 725. Instead, a conductive fill material is plated into the blind hole 725 using a bottom-up plating process. The plating process can be an electroless or an electrolytic process. In an electrolytic process, for example, a conductive member is pressed against the upper side of the terminal 352 while the backside 722 of the terminal 352 contacts a plating solution. A potential is applied between the conductive member and the plating solution to plate ions in the solution onto the backside 722 of the terminal 352. The ions will continue to plate onto each other in a bottom-up manner until the fill material fills the blind hole 725. The imaging unit 320 is then removed from the plating bath and the fill material remains in the blind hole 725 thus forming the interconnect 910. The interconnect 910 can accordingly have a backside end 914 upon which a solder-ball can be deposited or other features can be formed.

C. Optical Device Workpieces for Microelectronic Imagers

FIGS. 10A-19 illustrate several different optical device workpieces and embodiments of the optics fabrication procedure 204 (FIG. 2). The optical device workpieces shown in FIGS. 10A-19 can all be used with the imager workpiece 300 shown in FIG. 3 for wafer-level packaging of imagers.

Figure 10A:
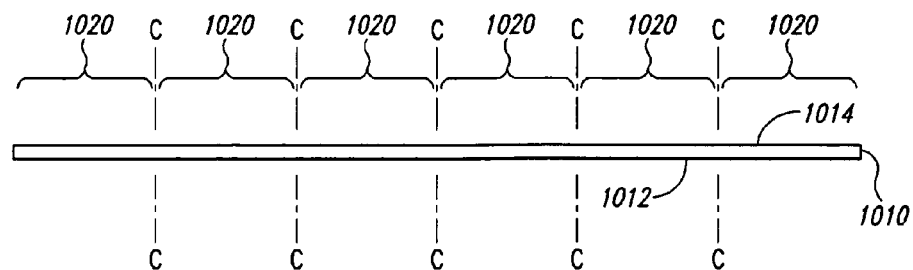
FIGS. 10A and 10B are schematic cross-sectional views illustrating a method for manufacturing an optical device workpiece having a plurality of optical devices in accordance with an embodiment of the invention for use in wafer-level packaging of microelectronic imagers.
Figure 10B:
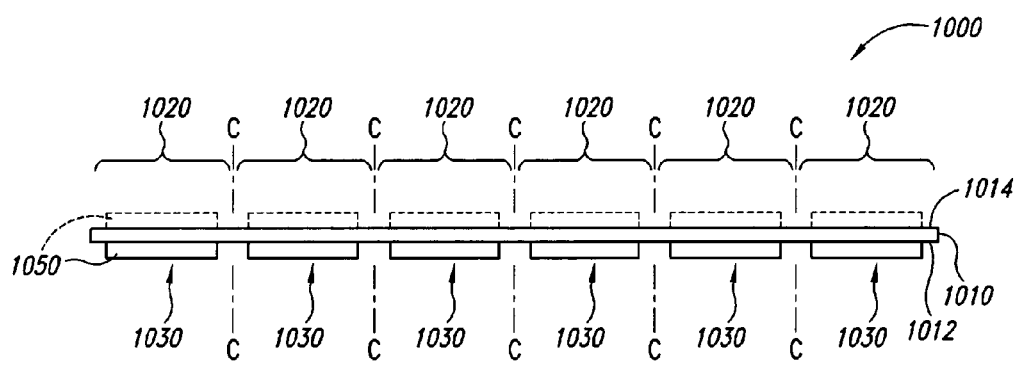

FIGS. 10A and 10B are schematic cross-sectional views illustrating a method for manufacturing an optical device workpiece 1000 (FIG. 10B) in accordance with an embodiment of the invention. The optical device workpiece 1000 includes a second substrate 1010 having a first side 1012 and a second side 1014. The second substrate 1010 further includes a plurality of discrete device sites 1020 at which individual optical devices 1030 (FIG. 10B) are constructed on and/or in the second substrate 1010. The boundaries of the device sites 1020 can be defined by cutting lanes C-C along which the second substrate 1010 can be cut to singulate individual optical devices from each other.

The second substrate 1010 is transmissive to a desired radiation. When the imagers are for use in cameras, for example, the substrate is transmissive to light in the visible spectrum. The second substrate 1010, however, can be transmissive to ultraviolet light, infrared radiation and/or any other suitable spectrum according to the particular application of the imager. The second substrate 1010 can be composed of glass, quartz, plastics and/or other materials.

The second substrate 1010 can also be configured to be handled by semiconductor fabrication equipment. As such, the second substrate 1010 can be a thin wafer having a thickness of approximately 300-1,500 µm and a diameter of approximately 200-300 µm, or it can have other dimensions suitable for being handled by automatic fabrication equipment.

Referring to FIG. 10B, the method continues by producing a plurality of optics elements 1050 on the second substrate 1010. The optical device workpiece 1000 typically has an optics element 1050 at each of the device sites 1020. The optics elements 1050 can be on the first side 1012 and/or the second side 1014 of the second substrate 1010. For example, the optics elements 1050 can include a first optic member (shown in solid lining) on the first side 1012 of the second substrate 1010 at the device sites 1020. In other embodiments, the optics elements 1050 can include a second optic member (shown in broken lining) on the second side 1014 of the second substrate 1010 in addition to or in-lieu of the first optic member.

The optics elements 1050 are configured to manipulate the radiation for use by the image sensors 330 (FIG. 3). For example, the optics elements 1050 can be lenses that direct the radiation for focusing, dispersing and/or removing higher order detractions from the radiation. Such optics elements 1050 can be lenses having a curvature and/or a pin-hole aperture. As explained in more detail below, the optics elements 1050 can be produced by molding a compound onto the second substrate 1010 or molding lenses separately from the second substrate 1010. The optics elements 1050 can also be produced by etching the second substrate 1010 or a layer of material on the second substrate 1010, and/or attaching individual optics elements to the second substrate 1010.

Figure 11:
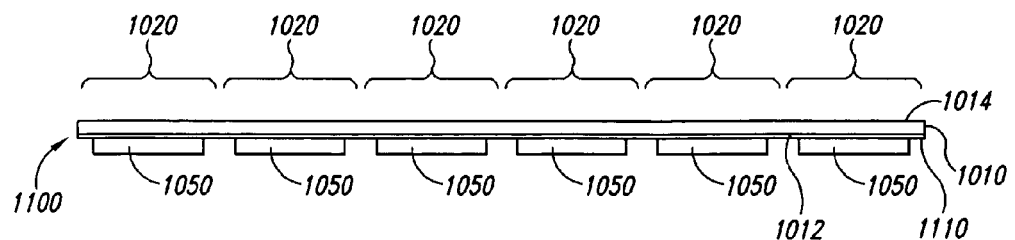
FIG. 11 is a schematic cross-sectional view illustrating an optical device workpiece in accordance with another embodiment of the invention for use in wafer-level packaging of microelectronic imagers.

FIG. 11 is a schematic cross-sectional view illustrating an optical device workpiece 1100 in accordance with another embodiment of the invention. The optical device workpiece 1100 is similar to the optical device 1000, and thus like reference numbers refer to like components in FIGS. 10A-11. The optical device workpiece 1100 is different than the optical device workpiece 1000 in that the optical device workpiece 1100 includes a filter 1110 on the second substrate 1010. The filter 1110 can be a single thin film or a stack of several films deposited onto the first or second sides 1012 or 1014 of the second substrate 1010. The filter 1110, for example, can be an IR filter to prevent infrared radiation from passing through the optics elements 1050. The filter 1110 can have several other embodiments for filtering other spectrums in addition to or in lieu of infrared radiation. In other embodiments, the filter 1110 can be formed on the optics elements 1050 instead of the second substrate 1010. The filter 1110 can accordingly be a layer of material that is "over" the second substrate 1010 in the sense that it can be directly on the second substrate 1010, the optics elements 1050, or another component attached to the second substrate 1010.

Figure 12:
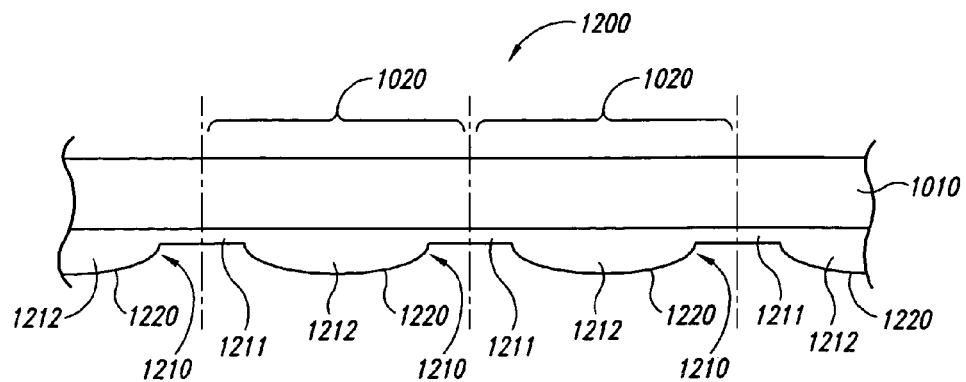
FIG. 12 is a schematic cross-sectional view illustrating an optical device workpiece in accordance with another embodiment of the invention for use in wafer-level packaging of microelectronic imagers.

FIG. 12 is a schematic cross-sectional view illustrating an optical device workpiece 1200 in accordance with another embodiment of the invention. Like reference numbers refer to like components in FIGS. 10B and 12. The optical device workpiece 1200 has a plurality of optics elements 1210, and each optics element 1210 is located at a device site 1020. The optics elements 1210 shown in FIG. 12 are formed with a common base 1211, and each optics element 1210 has a lens 1212 including a curved surface 1220 for directing the radiation as it passes through the optics element 1210. The curved surfaces 1220, which are shown schematically in FIG. 12, can have any combination of convex and/or concave curvatures with respect to the second substrate 1010 to provide the desired optics.

The optics elements 1210 shown in FIG. 12 are formed by molding a compound to form the base 1211 and individual lenses 1212. For example, the optics elements 1210 can be formed by an injection molding process in which the base 1211 is molded onto the second substrate 1010 and the lenses 1212 are molded integrally with the base 1211. Alternatively, the optics elements 1210 can be molded separately from the second substrate 1010 as a single unit, and then the base 1211 is attached to the second substrate 1010 with an adhesive. The optics elements 1210 are accordingly made from a suitable compound such as glass, quartz, plastics and/or other materials that can be molded into the desired shape and provide the desired transmission properties for the radiation.

Several embodiments of the optical device workpieces shown in FIGS. 10A-12 can significantly improve the quality of microelectronic imagers. For example, very small optics elements can be formed on the optical device workpieces within demanding tolerances. This is possible because the optics elements are formed using processes developed for manufacturing microelectronic devices. Thus, the embodiments of the optical devices in FIGS. 10A-12 can be smaller and/or produce better results because they can be formed and assembled with a high degree of precision.

Figure 1:
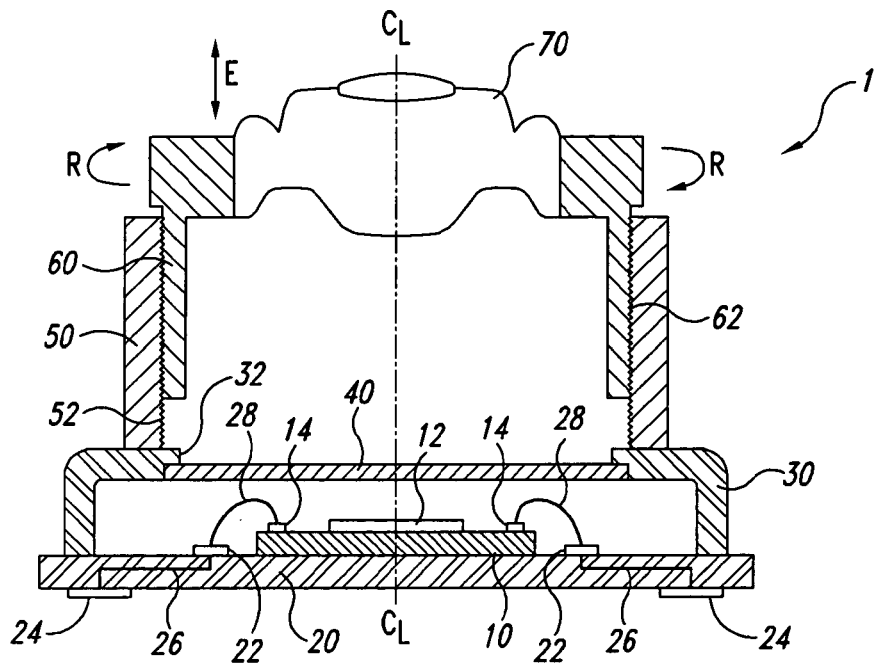
FIG. 1 is a cross-sectional view of a packaged microelectronic imager in accordance with the prior art.

Several embodiments of the optical device workpieces are further expected to improve the efficiency of packaging imagers compared to the manual process of packaging the conventional imager shown in FIG. 1. First, a plurality of imaging units and optics elements can be fabricated simultaneously at the wafer level using semiconductor fabrication techniques. Second, as explained in more detail below with reference to FIGS. 20A-22B, a plurality of the optical devices can be attached to a corresponding plurality of the imaging units at the wafer level using automated equipment. This accordingly eliminates manually positioning individual lenses with respect to individual imaging sensors, which should significantly enhance the throughput and yield of packaging microelectronic imagers.

Figure 13:
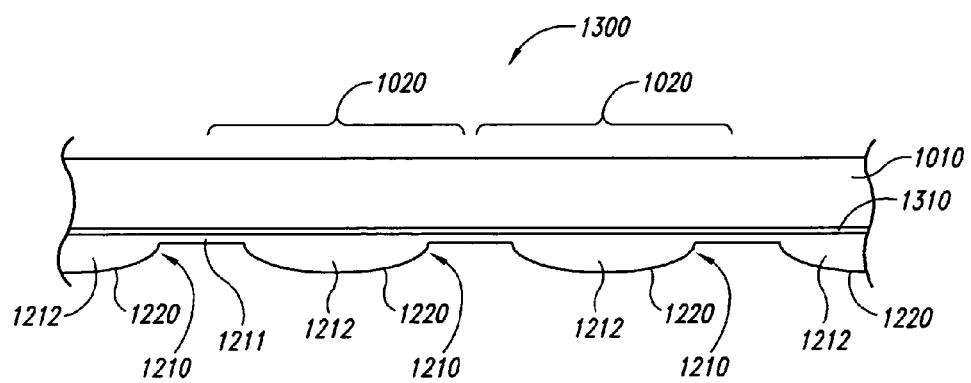
FIG. 13 is a schematic cross-sectional view illustrating an optical device workpiece in accordance with another embodiment of the invention for use in wafer-level packaging of microelectronic imagers.

FIG. 13 is a schematic cross-sectional view illustrating an optical device workpiece 1300 in accordance with another embodiment of the invention. The optical device workpiece 1300 is substantially similar to the optical device workpiece 1200 shown in FIG. 12, but the optical device workpiece 1300 includes a filter 1310 between the second substrate 1010 and the optics elements 1210. As explained above, the filter 1310 can be on the other side of the second substrate 1010 or on the exterior surfaces of the optics elements 1210. The filter 1310 prevents or otherwise inhibits undesirable radiation from passing through the optical devices.

Figure 14A:
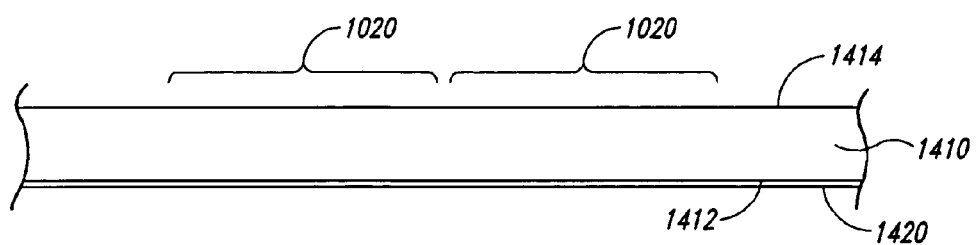
FIGS. 14A and 14B are schematic cross-sectional views illustrating a method for manufacturing an optical device workpiece having a plurality of optical devices in accordance with another embodiment of the invention for use in wafer-level packaging of microelectronic imagers.
Figure 14B:
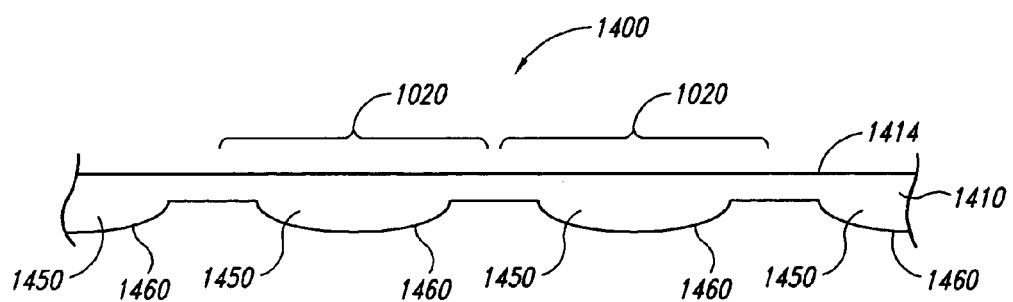

FIGS. 14A and 14B are schematic cross-sectional views illustrating a method for manufacturing an optical device workpiece 1400 (FIG. 14B) in accordance with another embodiment of the invention. Referring to FIG. 14A, this method includes providing a substrate 1410 having a first side 1412, a second side 1414, and a plurality of the device sites 1020. The substrate 1410 shown in FIG. 14A is substantially similar to the second substrate 1010 shown in FIG. 10A, but the substrate 1400 is patterned with a mask 1420 (shown schematically without apertures) to form the optics elements by etching the substrate 1410. The mask 1420 can be a layer of resist or other material that is patterned as known in the art of semiconductor manufacturing.

FIG. 14B illustrates the optical device workpiece 1400 after etching a plurality of optics elements 1450 into the substrate 1410. The optics elements 1450 typically include a curved surface 1460 that can have any desired curvature as described above with reference to the curved surface 1220 (FIG. 12). The optics elements 1450 are typically etched using a plurality of separate mask/etch steps to form the desired curvature(s) for the curved surfaces 1460. The particular mask/etch steps can be developed according to the parameters of the particular design of the optical devices using mask/etch technology developed in semiconductor manufacturing for reticles and other equipment.

Figure 15A:
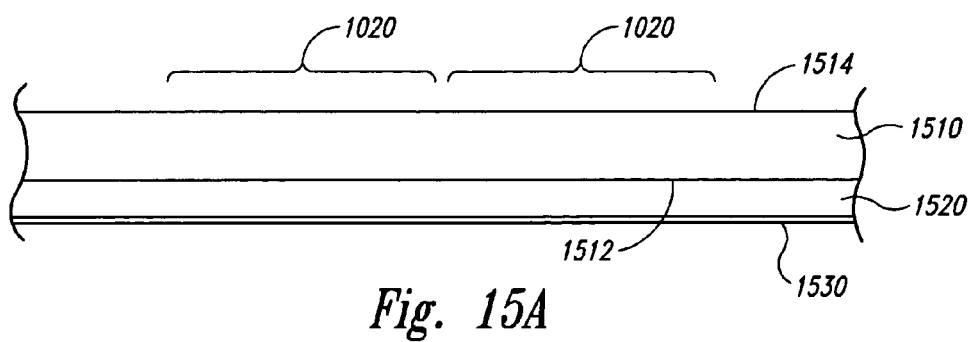
FIGS. 15A and 15B are schematic cross-sectional views illustrating a method for manufacturing an optical device workpiece having a plurality of optical devices in accordance with another embodiment of the invention for use in wafer-level packaging of microelectronic imagers.
Figure 15B:
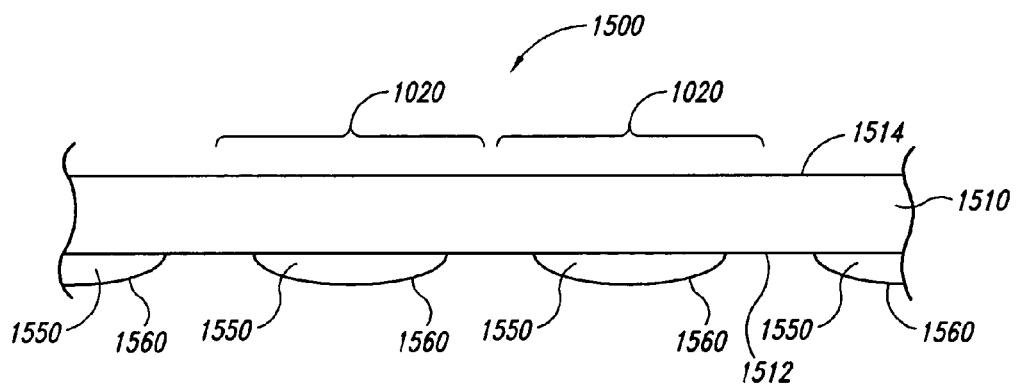

FIGS. 15A and 15B are schematic cross-sectional views of a method for manufacturing an optical device workpiece 1500 (FIG. 15B) in accordance with another embodiment of the invention. The optical device workpiece 1500 is fabricated using an etching process that is similar to the process described above with reference to FIGS. 14A-B. Referring to FIG. 15A, the optical device workpiece 1500 is constructed by providing a substrate 1510 having a first side 1512 and a second side 1514. This method continues by depositing a layer of lens material 1520 onto the substrate 1510 and patterning the lens material 1520 with a mask 1530 (shown schematically without apertures). Referring to FIG. 15B, the layer of lens material 1520 is etched using one or more mask/etch steps to form a plurality of optics elements 1550 on the substrate 1510. The optics elements 1550 are located at corresponding device sites 1020, and the optics elements 1550 have a desired surface 1560 for manipulating the radiation as it passes through the optics elements 1550. The optics elements 1550 can be different from the optics elements 1450 shown in FIG. 14B in that the optics elements 1550 can be composed of a different material than a substrate 1510. For example, the substrate 1510 can be a quartz plate and the optics elements 1550 can be plastic or another material having the desired configuration and transmissivity to manipulate the radiation accordingly.

Figure 16A:
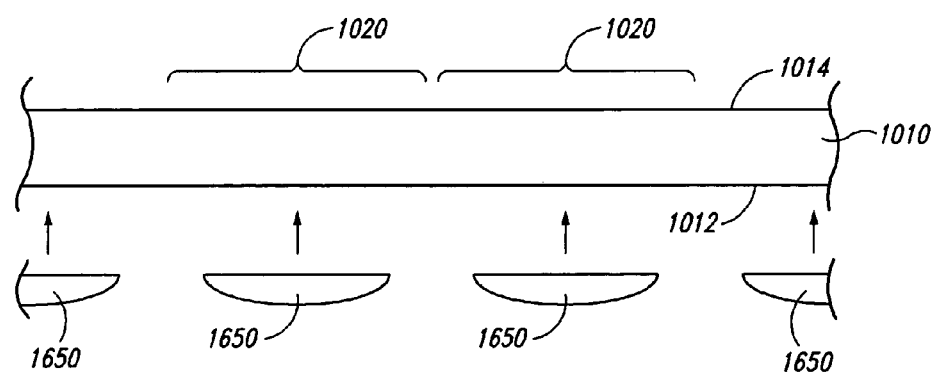
FIGS. 16A and 16B are schematic cross-sectional views illustrating a method for manufacturing an optical device workpiece having a plurality of optical devices in accordance with another embodiment of the invention for use in wafer-level packaging of microelectronic imagers.
Figure 16B:
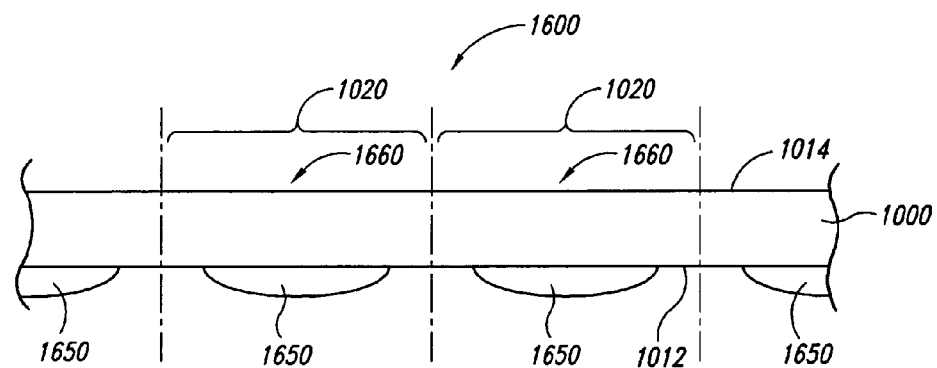

FIGS. 16A and 16B are schematic cross-sectional views illustrating another method for manufacturing an optical device workpiece 1600 (FIG. 16B) in accordance with an embodiment of the invention. The optical device workpiece 1600 includes the second substrate 1010 described above and a plurality of separate optics elements 1650. The optics elements 1650 are produced by molding and/or etching lenses separately from the second substrate 1010 and then attaching the lenses to the substrate. In one embodiment, the optics elements 1650 are etched from a substrate made from the same material or a different material than that of the second substrate 1010. Alternatively, the optics elements 1650 can be molded as a single unit that is subsequently cut into individual optics elements 1650, or the optics elements 1650 can be molded as individual pieces. Referring to FIG. 16B, the optics elements 1650 are attached to the second substrate 1010 at the device sites 1020 to form a plurality of optical devices 1660 on the optical device workpiece 1600.

Figure 17:
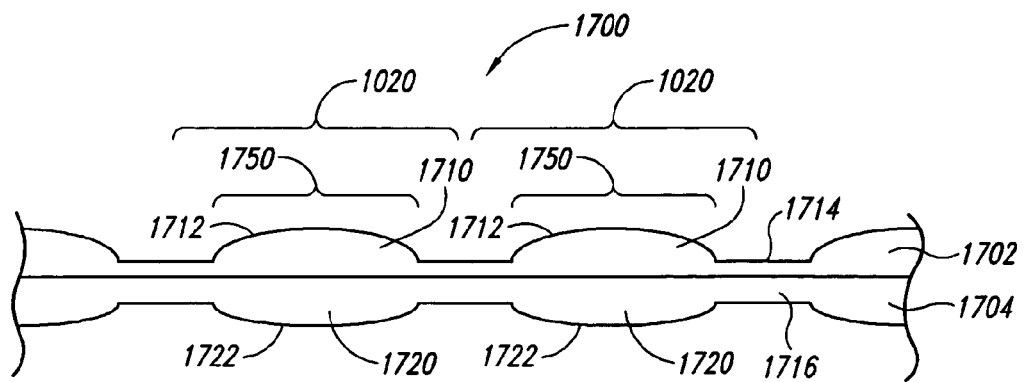
FIG. 17 is a schematic cross-sectional view illustrating an optical device workpiece having a plurality of optical devices in accordance with another embodiment of the invention for use in wafer-level packaging of microelectronic imagers.
Figure 18:
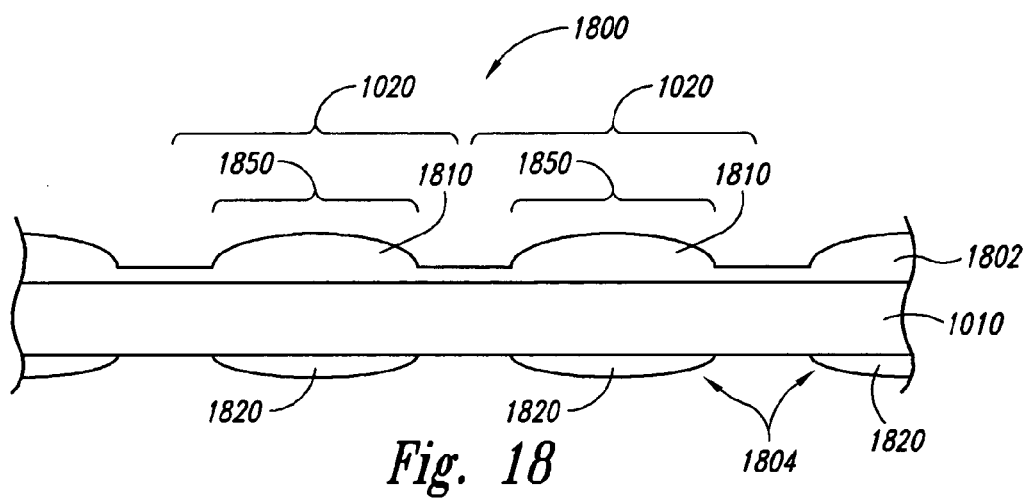
FIG. 18 is a schematic cross-sectional view illustrating an optical device workpiece having a plurality of optical devices in accordance with another embodiment of the invention for use in wafer-level packaging of microelectronic imagers.

The various features illustrated in the optical device workpieces shown in FIGS. 10A-16B can be combined to form other optical device workpieces. FIGS. 17 and 18, for example, are schematic cross-sectional views illustrating optical device workpieces 1700 and 1800, respectively, in accordance with additional embodiments of the invention. The optical device workpiece 1700 shown in FIG. 17 can have a first section 1702 and a second section 1704. The first section 1702 can include a plurality of first optic members 1710 having first curved surfaces 1712, and the second section 1704 can have a plurality of second optic members 1720 having second curved surfaces 1722. The first and second curved surfaces 1712 and 1722 can be different from one another according to the particular applications of the microelectronic imager. The first and second optic members 1710 and 1720 together define discrete optics elements 1750 at the device sites 1020.

The first section 1702 can be formed by molding a material to shape the first optic members 1710 and a base 1714. The base 1714 can be characterized as a substrate in the sense that it interconnects the first optic members 1710. Alternatively, the first section 1702 can be formed by etching the first optic members 1710 from a substrate. The second section 1704 can be formed by etching or molding the second optic members 1720 in a manner similar to the first section 1702. The first and second sections 1702 and 1704 are then assembled to form the optical device workpiece 1700.

The optical device workpiece 1800 shown in FIG. 18 illustrates another combination of components. The optical device workpiece 1800 includes the second substrate 1010, a first section 1802 having a plurality of first optic members 1810 on one side of the second substrate 1010, and a second section 1804 having a plurality of second optic members 1820 on the other side of the second substrate 1010. The first optic members 1810 can be similar to the molded optics elements 1210 shown in FIGS. 12 and 13, or the etched optics elements 1450 shown in FIG. 14B. The second optic members 1820 of the second section 1804 can be similar to the optics elements 1550 shown in FIG. 15B or the optics elements 1650 shown in FIG. 16B.

Figure 19:
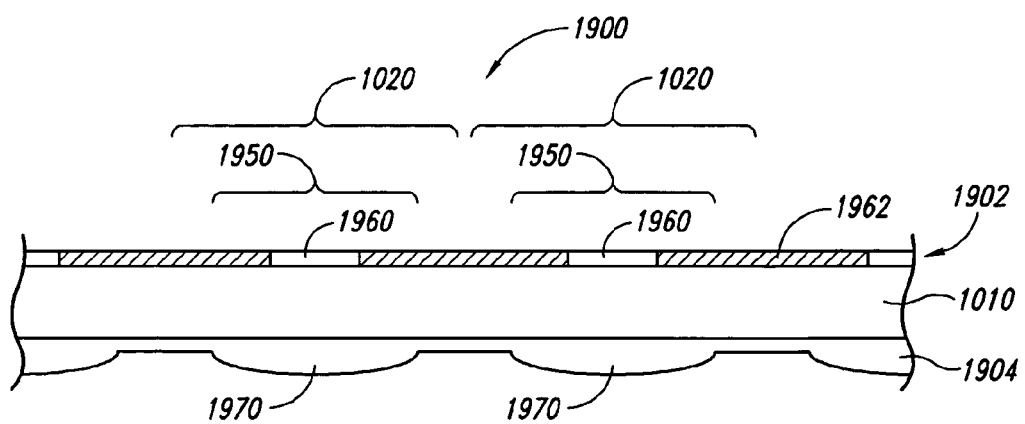
FIG. 19 is a schematic cross-sectional view illustrating an optical device workpiece having a plurality of optical devices in accordance with another embodiment of the invention for use in wafer-level packaging of microelectronic imagers.

FIG. 19 is a schematic cross-sectional view illustrating another optical device workpiece 1900 in accordance with another embodiment of the invention. The optical device workpiece 1900 includes the second substrate 1010 with the device sites 1020 and a plurality of optics elements 1950 at the device sites 1020. The optics elements 1950 can include a first section 1902 and a second section 1904. The first section 1902 includes first optic members defined by a plurality of pin-hole apertures 1960 in an opaque layer 1962. The second section 1904 can include a plurality of second optic members 1970. The second optic members 1970 can be formed according to any of the embodiments for constructing the optics elements shown in FIGS. 10A-18. The pin-hole apertures 1960 and the second optic members 1970 together define the optics elements 1950.

It will be appreciated that various modifications may be made to several of the embodiments of the optical device workpieces in FIGS. 10A-19. For example, the pin-hole apertures shown in FIG. 19 can be combined with any of the optical device workpieces shown in FIGS. 10A-18. Additionally, the term "substrate" can include wafer-like substrates and/or molded base sections of the optical device workpieces.

D. Wafer-level Packaging of Microelectronic Imagers

FIGS. 20A-22B illustrate several methods of the assembly procedure 206 (FIG. 2) for wafer-level packaging of microelectronic imagers using the imager workpiece 300 (FIG. 3) and the optical device workpiece 1000 (FIG. 10B). The imager workpiece 300 can have any of the interconnects shown above in FIGS. 4A-9, and the optical device workpiece can be any of those described above with reference to FIGS. 10A-19. Like reference numbers accordingly refer to similar components in FIGS. 3, 10B and 20 A-22 B.

Figure 20A:
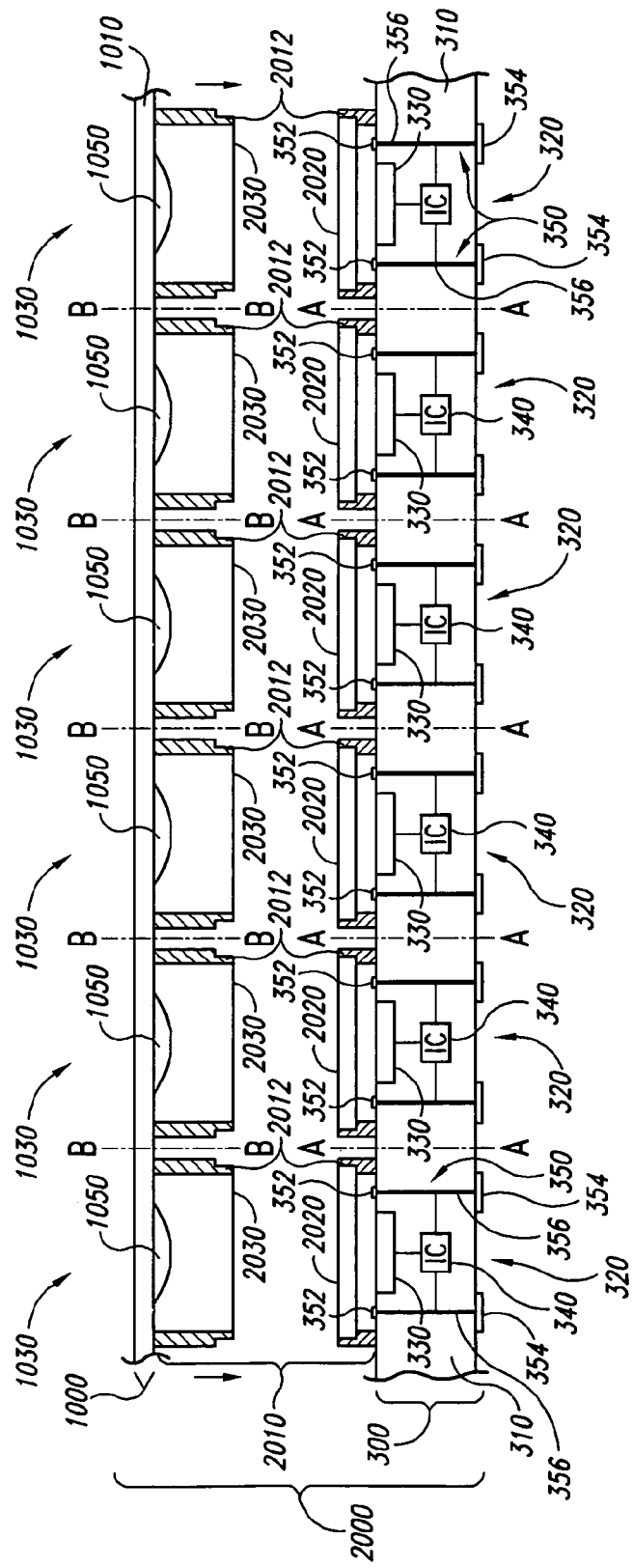
FIG. 20A is a side cross-sectional view schematically illustrating an imager workpiece having a plurality of imaging units and an optical device workpiece having a plurality of optical devices in accordance with an embodiment of the invention at one stage of a wafer-level packaging process for packaging microelectronic imagers.

FIG. 20A is a side cross-sectional view showing a portion of a wafer-level microelectronic imager assembly 2000 in which the imager workpiece 300 is aligned with the optical device workpiece 1000 as part of the assembly procedure 206 (FIG. 2). In addition to the imager workpiece 300 and the optical device workpiece 1000, the imager assembly 2000 can also include a spacer 2010. In the embodiment shown in FIG. 20A, the spacer 2010 includes a plurality of stand-offs 2012 that position the image sensors 330 and corresponding optics elements 1050 relative to each other and provide sealed cells in which individual image sensors 330 are contained. The individual stand-offs 2012 can each include a first referencing element 2020 projecting from the first substrate 310 and a second referencing element 2030 projecting from the second substrate 1010. The first and second referencing elements 2020 and 2030 can be similar to any of the referencing elements shown and described in U.S. patent application Ser. No. 10/723,366, entitled "Packaged Microelectronic Imagers and Methods for Packaging Microelectronic Imagers," which is herein incorporated by reference in its entirety. The spacer 2010, however, can have other embodiments such that packaged microelectronic devices in accordance with the invention are not limited to the spacer 2010 shown in FIGS. 20A and 20B. For example, the stand-offs between the optical devices 1030 and the imaging units 320 do not need to have separate referencing elements as shown in FIG. 20A, but rather they can be single components constructed on just one of the first or second substrates 310 or 1010.

Figure 20B:
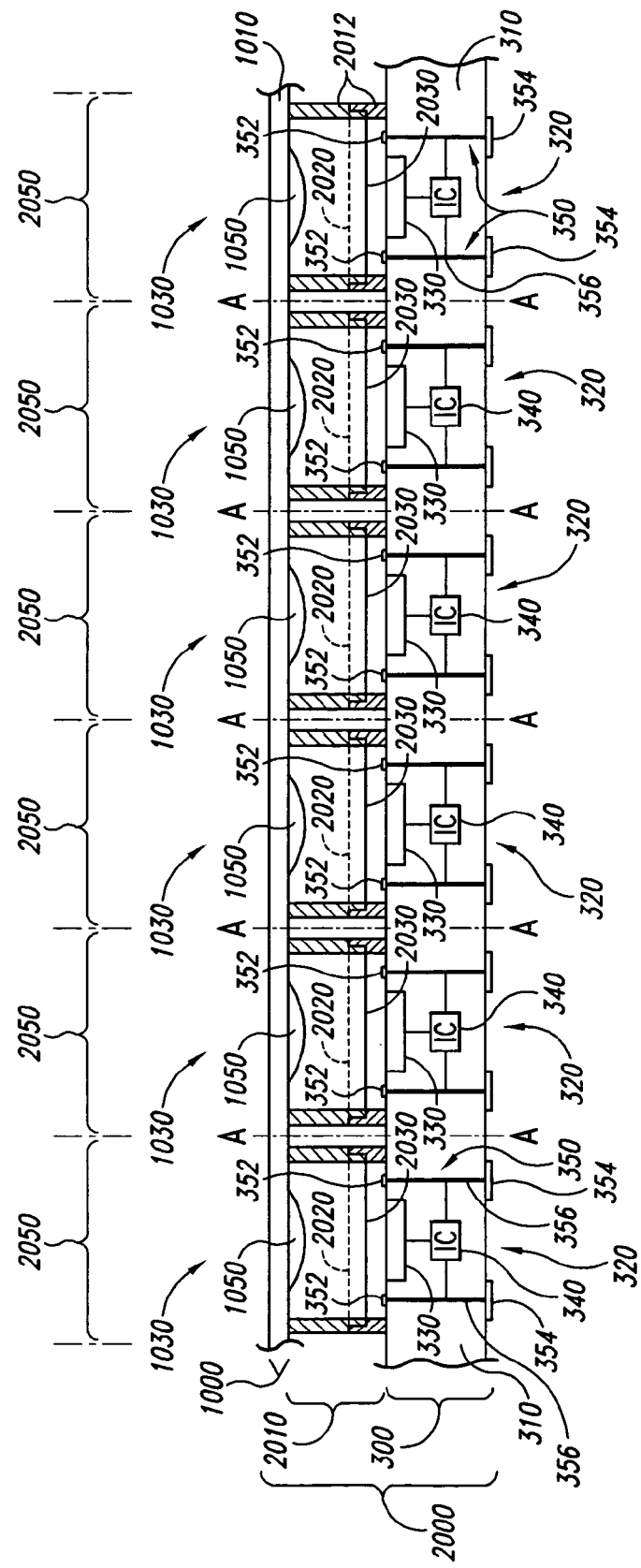
FIG. 20B is a side cross-sectional view schematically illustrating a plurality of assembled microelectronic imagers including the imager workpiece and the optical device workpiece of FIG. 20A in accordance with an embodiment of the invention.

FIG. 20B is a schematic cross-sectional view illustrating a plurality of microelectronic imagers 2050 that have been packaged at the wafer level in accordance with one embodiment of the assembly procedure 206 (FIG. 2). The imagers 2050 can be assembled by seating each first referencing element 2020 with a corresponding one of the second referencing elements 2030. In this embodiment, the first and second referencing elements 2020 and 2030 are seated together before cutting either the first substrate 310 or the second substrate 1010 such that all of the microelectronic imagers 2050 are assembled at the wafer level. The first substrate 310 and the second substrate 1010 can then be cut along lines A-A to separate the individual imagers 2050 from each other. The first and second substrates 310 and 1010 can be cut simultaneously using either a single blade that cuts through both of the substrates or two different blades that each cut through a single one of the substrates. In other embodiments, the first and second substrates 310 and 1010 can be cut in two separate stages in which one of the substrates is cut first and then the other substrate is cut second.

Figure 21A:
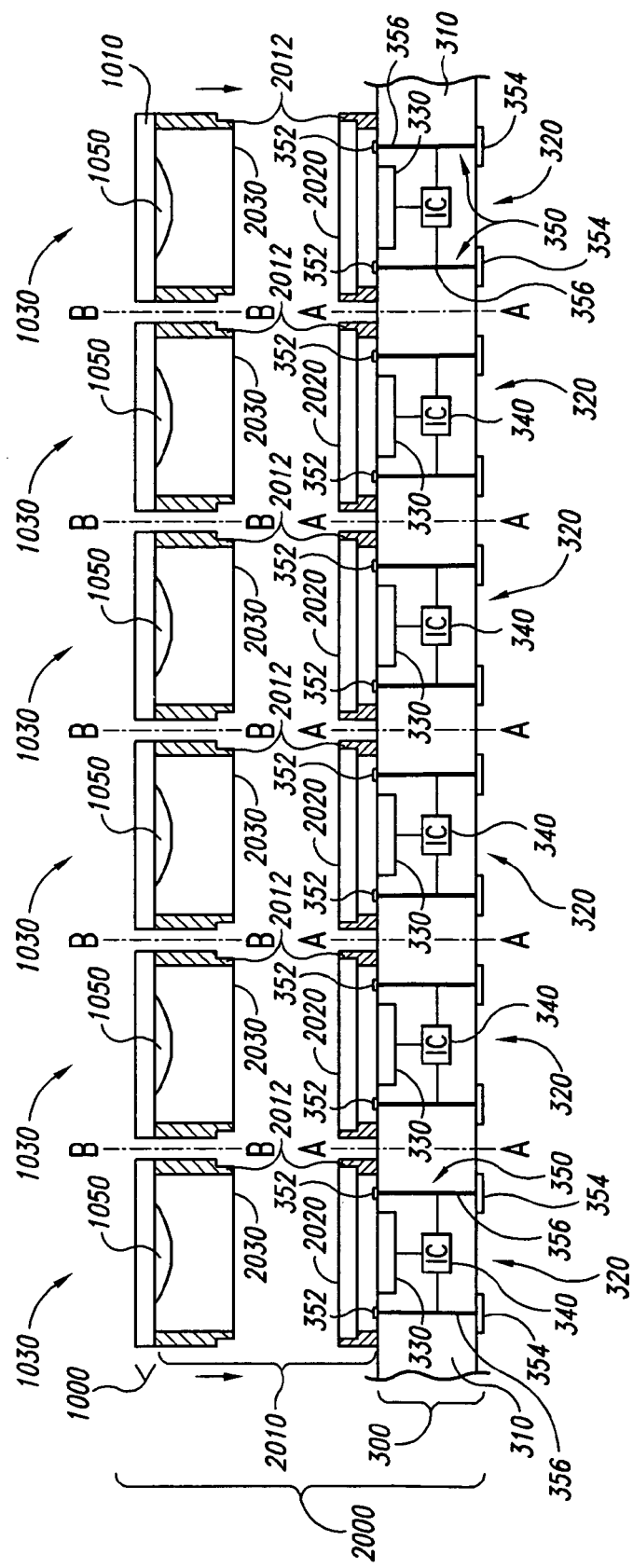
FIG. 21A is a side cross-sectional view schematically illustrating an imager workpiece having a plurality of imaging units and an optical device workpiece having a plurality of optical devices in accordance with an embodiment of the invention at one stage of a wafer-level packaging process for packaging microelectronic imagers.
Figure 21B:
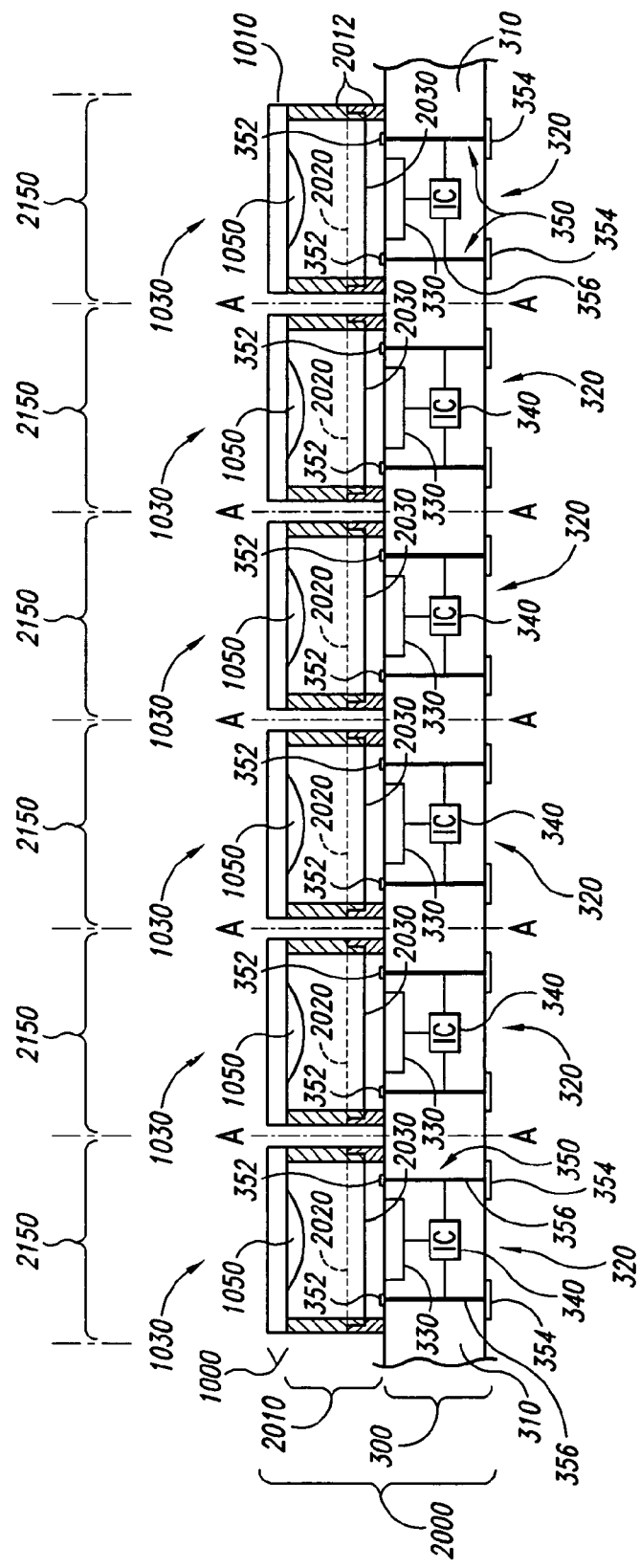
FIG. 21B is a side cross-sectional view schematically illustrating a plurality of assembled microelectronic imagers including the imager workpiece and the optical device workpiece of FIG. 21A in accordance with an embodiment of the invention.

FIGS. 21A and 21B illustrate a different embodiment of the assembly procedure 206 shown in FIG. 2. In this embodiment, the second substrate 1010 of the optical device workpiece 1000 has been cut to singulate the individual optical devices 1030 before attaching the optical devices 1030 to the imaging units 320. Referring to FIG. 21B, each one of the separated optical devices 1030 is mounted to a corresponding one of the imaging units 320, and the first substrate 310 is cut along lines A-A to separate individual imaging units 2150 from each other. One advantage of this embodiment is that the imager workpiece 300 can be probed to determine "known-good" imaging units 320 before attaching the optical devices 1030 to the imaging units 320. As such, the optical devices 1030 can be attached to only the known-good imaging units 320 to avoid wasting good optical devices.

Figure 22A:
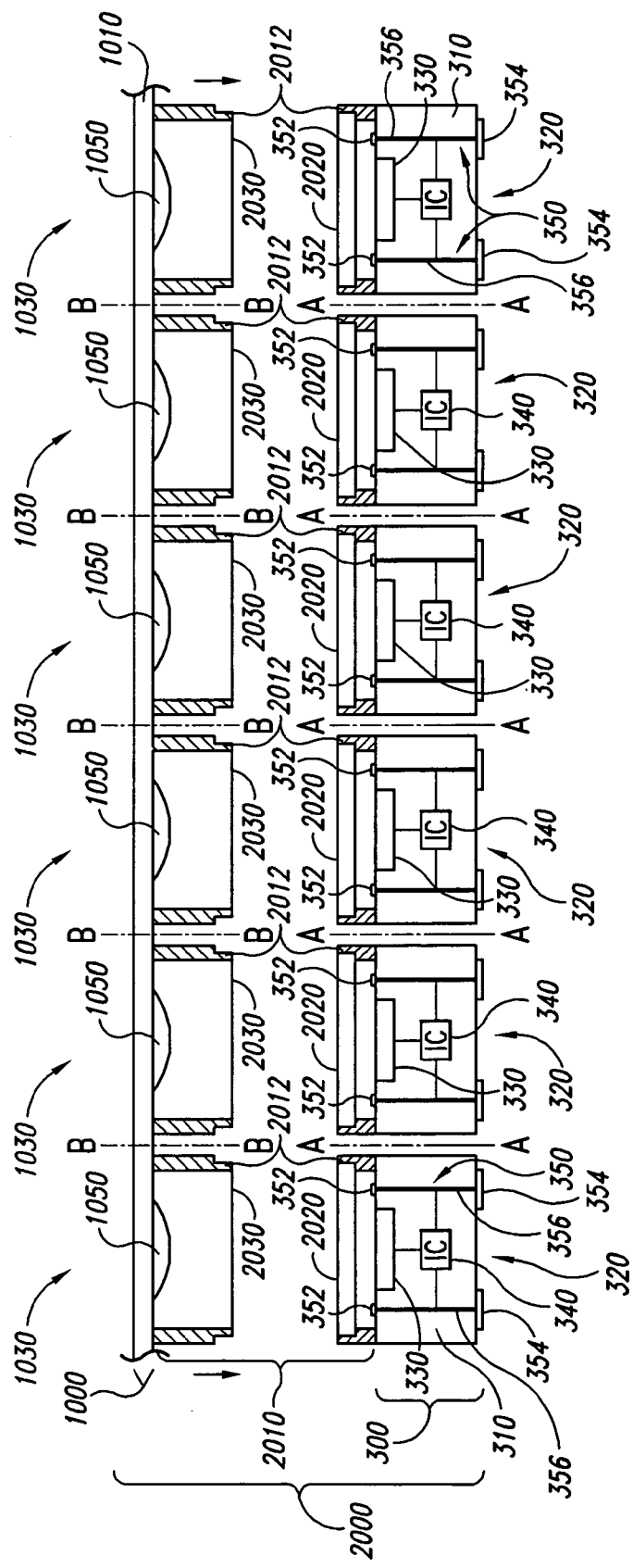
FIG. 22A is a side cross-sectional view schematically illustrating an imager workpiece having a plurality of imaging units and an optical device workpiece having a plurality of optical devices in accordance with an embodiment of the invention at one stage of a wafer-level packaging process for packaging microelectronic imagers.
Figure 22B:
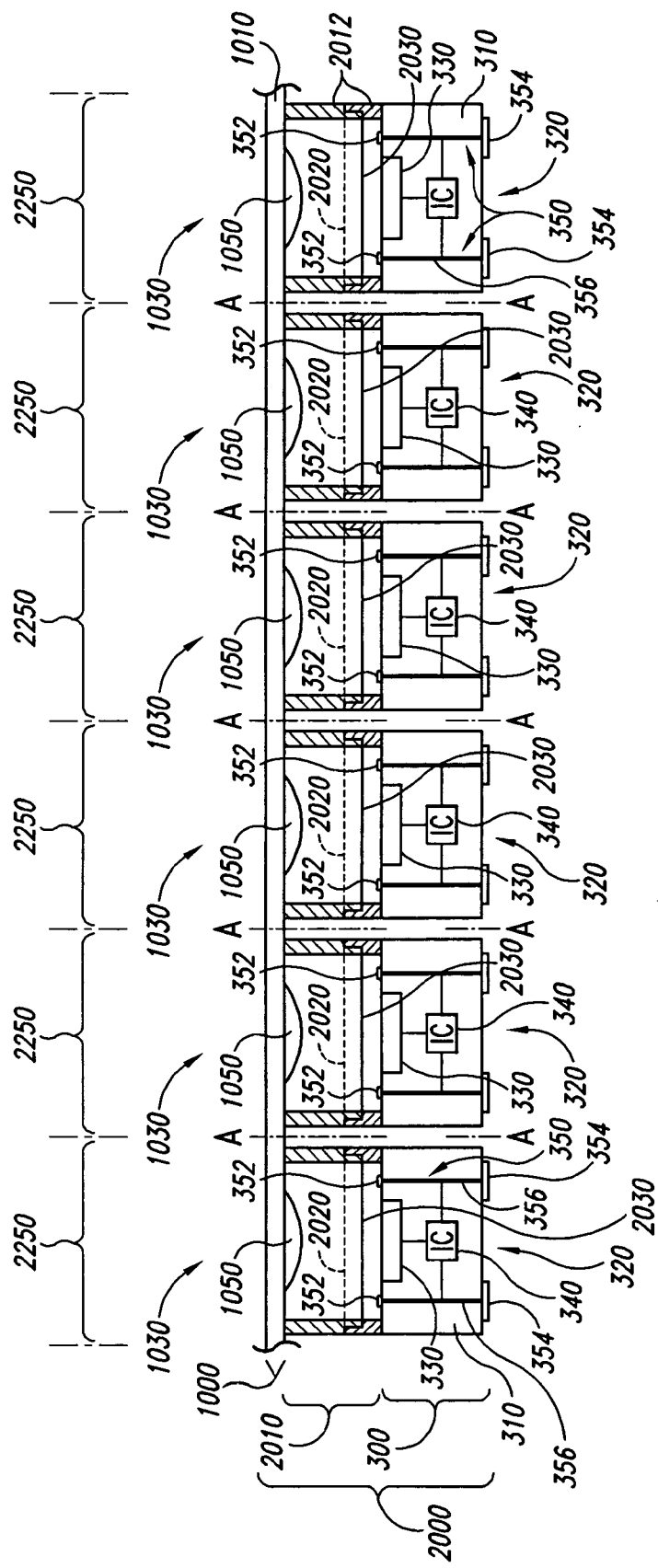
FIG. 22B is a side cross-sectional view schematically illustrating a plurality of assembled microelectronic imagers including the imager workpiece and the optical device workpiece of FIG. 22A in accordance with an embodiment of the invention.

FIGS. 22A and 22B illustrate another embodiment of the assembly procedure 206 of FIG. 2. In this embodiment, the first substrate 310 is cut along lines A-A to separate individual imaging units 320 from each other before fixing the optical devices 1030 and the imaging units 320 together. Referring to FIG. 22B, the separated imaging units 320 are fixed relative to the optical devices 1030 before cutting the second substrate 1010 to form a plurality of imaging units 2250. The second substrate 1010 is then cut along lines A-A to separate the imagers 2250 from each other. As with the assembly procedure described above with reference to FIGS. 21A-21 B, an advantage of the embodiment of the assembly procedure shown in FIGS. 22A-22B is that only known-good imaging units 320 can be fixed relative to the optical devices 1030 to avoid wasting optical devices.

Wafer-level packaging of the microelectronic imagers 2050/2150/2250 (shown in FIGS. 20B, 21B and 22 B) is enabled, at least in part, by: (a) forming an imaging workpiece in which individual imaging units have backside arrays of external contacts; and (b) forming an optical device workpiece with a plurality of individual optical devices arranged in a pattern corresponding to the pattern of the imaging units on the imaging workpiece. Because the through-wafer interconnects provide an array of external contacts on the backside of the imaging units, it is not necessary to wire bond bond-pads on the front side to external devices. The front side of the imager workpiece can accordingly be covered early on in the packaging process. This enables the process of (a) fabricating a plurality of imaging units at the wafer level on one substrate, (b) fabricating a plurality of optical devices at the wafer level on another substrate, and (c) assembling a plurality of the optical devices with a corresponding plurality of imaging units using automated equipment. Compared to conventional processes that assemble the optical devices with the imaging units by hand, the wafer-level processes described above are not only much faster, but also significantly more accurate. Therefore, the wafer-level processes described above with through-wafer interconnects significantly enhance the throughput and quality of packaged microelectronic imagers.

Another advantage of the microelectronic imagers 2050/2150/2250 is that they occupy less real estate on the boards in cell phones, PDAs, or other types of devices. Because the through-wafer interconnects in the imagers 2050/2150/2250 eliminate the need for an interposer substrate to provide external electrical contacts, the footprint of the imagers can be the same as that of the imaging unit 320 instead of the interposer substrate. The area occupied by the imagers is accordingly less than conventional imagers because the footprint of the individual imaging units 320 is significantly smaller than that of the interposer substrate. Furthermore, the imagers 2050/2150/2250 have a lower profile because eliminating the interposer substrate 20 (FIG. 1) from the packaged device reduces the profile by the thickness of the interposer substrate. The imagers 2050/2150/2250 also eliminate the height of the housing 30 (FIG. 1) because the optical devices formed in the methods described above with reference to FIGS. 10A-19 integrate the cover and the optics together. Therefore, the time and costs for (a) mounting an imaging unit to an interposer substrate and (b) attaching an individual housing to a die are eliminated. This results in greater throughput, lower packaging costs, and smaller imagers.

A further advantage of wafer-level imager packaging is that the microelectronic imagers 2050/2150/2250 can be tested from the backside of the imaging units 320 at the wafer level before the individual imagers are singulated. A test probe can test the individual microelectronic imagers using the through-wafer interconnects and backside electrical contact pads. Accordingly, because the test probe engages contact pads on the backside of the imagers, it will not damage the image sensors 330, the optical devices 1030, or associated circuitry on the front of the microelectronic imagers. Moreover, the test probe cannot obstruct the image sensors 330 during a backside test, which allows the test probe to test a larger number of imaging units 320 at one time compared to processes that test imaging dies from the front side. It is accordingly more efficient in terms of cost and time to test the microelectronic imagers at the wafer level (i.e., before singulation) than to test each imager from the front side of the dies. Furthermore, it is advantageous to test the microelectronic imagers in an environment where the individual image sensors 330 and/or optics units 1050 will not be damaged during testing.

Yet another advantage of wafer-level processing is that the first substrate 310 can be singulated after assembling the optical devices 1030 to the imaging units 320. The optical devices 1030 can accordingly protect the imager sensors 330 from particles generated during the singulation process. Thus, the likelihood that the image sensors 330 will be damaged during singulation and subsequent handling is significantly reduced.

FIGS. 23A-23P illustrate a different embodiment of a wafer-level packaging process that provides a backside array of contact pads in accordance with another embodiment of the invention. FIGS. 23A-23P are all schematic cross-sectional views illustrating sequential stages of this method. Like reference numbers accordingly refer to like components throughout FIGS. 23A-23P.

FIG. 23A illustrates an imager workpiece 2302 and a spacer 2304 attached to the imager workpiece 2302. The imager workpiece 2302 includes a first substrate 2310 having a front side 2311 and a backside 2312. The imager workpiece 2302 can further include a plurality of microelectronic image sensors 2320 operatively coupled to integrated circuitry (not shown) within the substrate 2310 and front side terminals 2330 electrically coupled to the integrated circuitry. The spacer 2304 includes a plurality of standoffs 2340 between the image sensors 2320. The standoffs 2340, for example, can be a unitary grid formed on top of the front side terminals 2330. Referring to FIG. 23B, an adhesive 2342 is applied to the upper ends of the standoffs 2340 to receive an optical device workpiece.

Figure 23C:
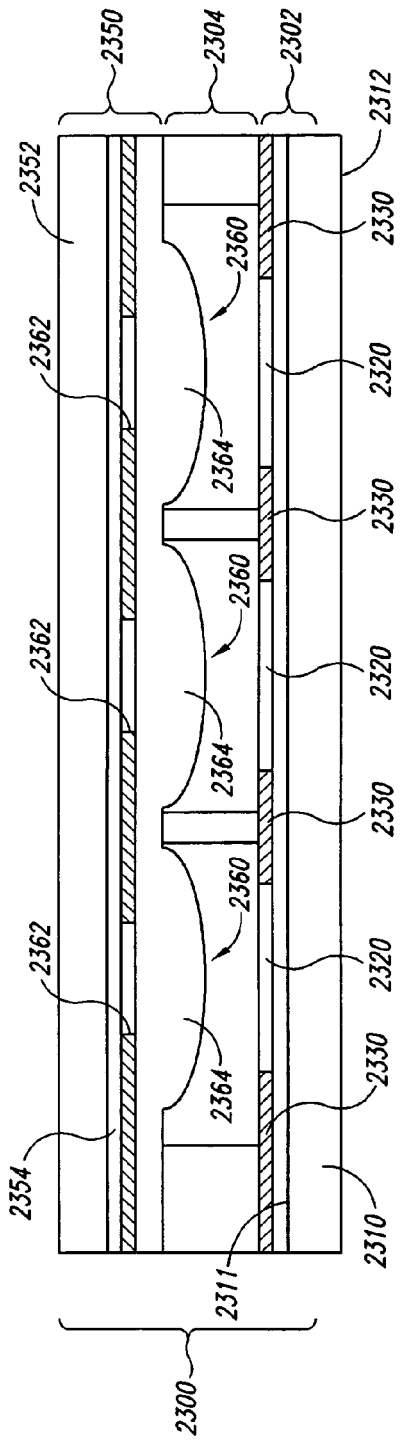
FIGS. 23A-23P are side cross-sectional views illustrating a method for packaging microelectronic imagers at the wafer level in accordance with another embodiment of the invention.

FIG. 23C illustrates an assembly 2300 including the imager workpiece 2302, the spacer 2304, and an optical device workpiece 2350. The optical device workpiece 2350 includes a second substrate 2352, a filter 2354 on the second substrate 2352, and a plurality of optics elements 2360. The optics elements 2360 can include a plurality of pin-hole apertures 2362 and a plurality of focus lenses 2364 (shown schematically). The optics elements 2360, however, can have several other embodiments in which the pin-hole apertures 2362 and/or the focus lenses 2364 are either different or omitted as described above with reference to FIGS. 10A-19.

Figure 23D:
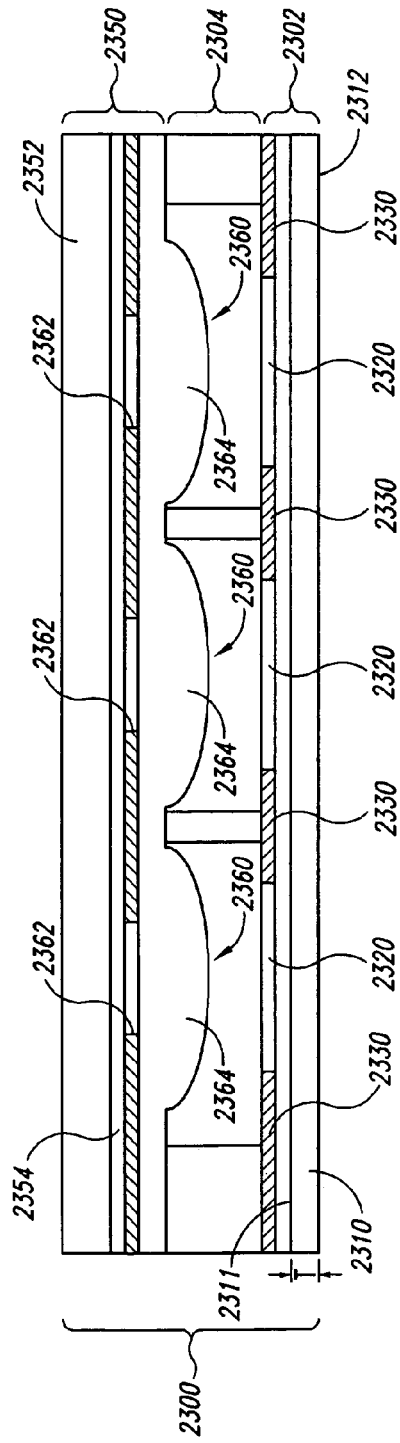

FIG. 23D illustrates the assembly 2300 after the first substrate 2310 has been thinned to a desired thickness "T." A layer of resist 2370 is deposited onto the backside 2312 of the first substrate 2310 and patterned to have apertures 2372 generally aligned with the front side terminals 2330 (FIG. 23E). The first substrate 2310 is then etched to form holes 2380 under the front side terminals 2330 (FIG. 23F). The etching process in FIG. 23F can be isotropic, but anisotropic etches can also be used.

Figure 23G:
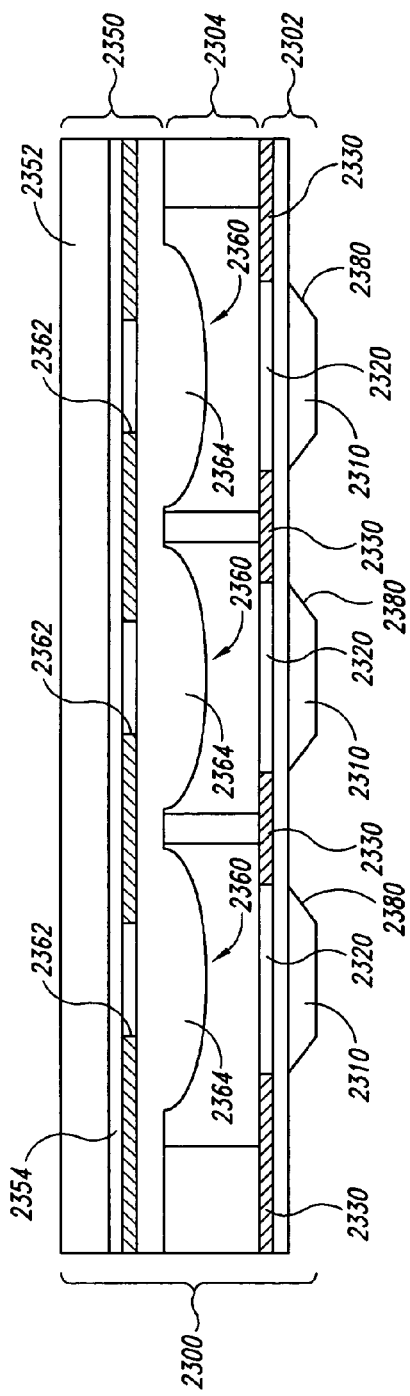
Figure 23H:
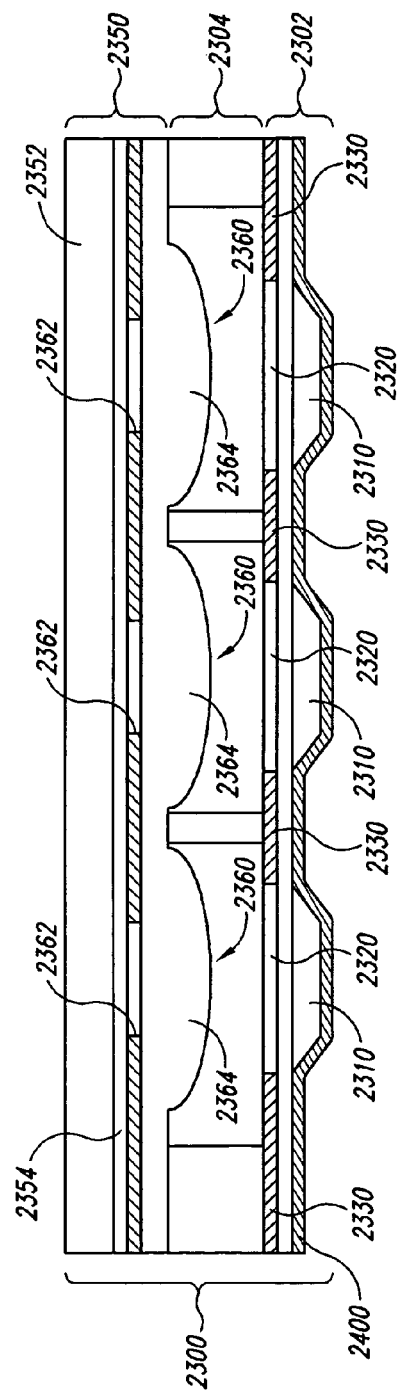

FIGS. 23G-23H illustrate additional procedures in this process. Referring to FIG. 23G, the layer of resist 2370 is removed, and a dielectric layer 2400 is then deposited onto the backside of the first substrate 2310 (FIG. 23H). Following the dielectric layer 2400, a layer of resist 2410 is then deposited onto the dielectric layer 2400 and patterned to have a plurality of apertures 2412 generally aligned with the front side terminals 2330 (FIG. 23I).

FIGS. 23J-23P illustrate the final stages of forming backside contact pads on the assembly 2300. After patterning the layer of resist 2410 as shown in FIG. 23I, the dielectric layer 2400 and the first substrate 2310 are etched to expose the backside of the terminals 2320 (FIG. 23J). The layer of resist 2410 is then stripped from the assembly 2300, and a layer of metal 2500 or other conductive material is deposited onto the backside of the assembly 2300 (FIG. 23K). A layer of resist 2510 is then deposited onto the metal layer 2500 and patterned to have apertures 2512 (FIG. 23K). The metal layer 2500 is then etched through apertures 2512 of the resist layer 2510 to form openings 2520 in the metal layer 2500 (FIG. 23L). Referring to FIG. 23M, another dielectric layer 2600 is then deposited onto the backside of the assembly and patterned to have apertures 2610 over corresponding sections of the metal layer 2500. The apertures 2610 are then filled with a metal to form backside contact pads 2612. The metal can be plated into the apertures 2512 using an electroplating or electroless plating process, or the metal can be deposited into the apertures 2512 using solder-wave or stenciling processes. FIG. 23O illustrates the assembly 2300 after solder balls or other interconnect structures 2620 are deposited onto the backside contact pads 2612, and FIG. 23P illustrates the assembly 2300 after cutting the imaging workpiece 2302 and the optical device workpiece 2350 to form individual imagers 2700.

The individual imagers 2700 provide many of the same features as the imagers 2050/2150/2250 described above with reference to FIGS. 20B, 21B and 22B. The metal layer 2500 provide backside interconnects to the backside contact pads 2612. As such, the imagers 2700 are also expected to have similar advantages as the imagers 2050/2150/2250 described above.

From the foregoing, it will be appreciated that specific embodiments of the invention have been described herein for purposes of illustration, but that various modifications may be made without deviating from the spirit and scope of the invention. The features and components of any of the embodiments shown above can be interchanged with each other in additional embodiments of the invention. For example, the standoffs 2340 of the spacer 2304 shown in FIGS. 23A-23P can be substituted for the spacer in FIGS. 20A-22B. Accordingly, the invention is not limited except as by the appended claims.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A microelectronic imager comprising:
an optical device formed from an optical device workpiece, the optical device comprising an optical element for transmitting light onto an image sensor aligned with the optical element;
an imaging unit, the imaging unit comprising the image sensor, an integrated circuit formed in a substrate, and a plurality of external contacts comprising a terminal disposed on a first surface of the substrate, a contact pad disposed on a second surface of the substrate opposite the first surface and an interconnect electrically coupling the terminal to the contact pad, wherein the interconnect extends completely through the terminal and the substrate wherein the terminal has an inner surface and an outer portion and wherein the interconnect is formed in a via that is formed through and therefore surrounded by the inner surface of the terminal, and wherein the contact pad is electrically operatively coupled to the image sensor via the integrated circuit;
the imager further comprising at least one stand-off projecting from at least one of the optical device and the imaging unit, the stand-off comprising a referencing element for mounting the optical element to the imaging unit.

2. The microelectronic imager of claim 1 wherein the via is formed through the terminal by:
forming the terminal in first and second dielectric layers formed on the substrate;
patterning the second layer to expose the terminal; and
forming a hole through the terminal.

3. The microelectronic imager of claim 2, wherein the via is formed through the terminal by:
forming a third dielectric layer on the second dielectric layer thereby covering the terminal and filling the hole formed in the terminal; and
forming a second hole in the third dielectric layer that is open to the first hole.

4. The microelectronic imager of claim 3, wherein the via is formed by forming a through hole from the second surface to open the first hole in the terminal.

5. The microelectronic imager of claim 4, wherein the interconnect is formed by:
forming a fourth dielectric layer on the third dielectric layer and the exposed portions of the terminal and the via; and
forming a first conductive layer over the fourth dielectric layer.

6. The microelectronic imager of claim 5, wherein the interconnect is further formed by removing a portion of the first conductive layer so that the remaining portion of the first conductive layer substantially lines the via.

7. The microelectronic imager of claim 6, wherein the first conductive layer is a seed layer and the interconnect is further formed by plating a second conductive layer on the seed layer.

8. The microelectronic imager of claim 7, wherein the interconnect is further formed by removing the fourth dielectric layer from over the third dielectric layer so that the remaining portion of the fourth dielectric layer underlies the first conductive layer and is on the second surface of the substrate.

9. The microelectronic imager of claim 8, wherein the interconnect is further formed by depositing a third conductive layer into the via.

10. The microelectronic imager of claim 2, wherein the via is formed by forming a through hole from the second surface that is open to the first hole in the terminal.

11. The microelectronic imager of claim 2, wherein the interconnect is formed by:
forming a third dielectric layer on the second dielectric layer and the exposed portions of the terminal and the via; and
forming a first conductive layer over the third dielectric layer.

12. The microelectronic imager of claim 11, wherein the interconnect is further formed by removing a portion of the first conductive layer so that the remaining portion of the first conductive layer substantially lines the via.

13. The microelectronic imager of claim 12, wherein the first conductive layer is a seed layer and the interconnect is further formed by plating a second conductive layer on the seed layer.

14. The microelectronic imager of claim 13, wherein the interconnect is further formed by removing the third dielectric layer from over the second dielectric layer so that the remaining portion of the third dielectric layer underlies the first conductive layer and is on the second surface of the substrate.

15. The microelectronic imager of claim 14, wherein the interconnect is further formed by depositing a third conductive layer into the lined via.

16. The microelectronic imager of claim 1, wherein the interconnect is formed by:
forming a first conductive layer over the substrate with first and second dielectric layers formed thereon and removing a portion of the first conductive layer so that the remaining portion of the first conductive layer substantially lines the via.

17. The microelectronic imager of claim 16, wherein the first conductive layer is a seed layer and the interconnect is further formed by plating a second conductive layer on the seed layer.

18. The microelectronic imager of claim 17, wherein the interconnect is further formed by depositing a third conductive layer into the lined via.

* * * * *